US007755131B2

(12) United States Patent
Kinoshita

(10) Patent No.: US 7,755,131 B2
(45) Date of Patent: Jul. 13, 2010

(54) NAND-TYPE NON-VOLATILE SEMICONDUCTOR MEMORY DEVICE AND METHOD OF MANUFACTURING THE SAME

(75) Inventor: Hideyuki Kinoshita, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 76 days.

(21) Appl. No.: 12/024,293

(22) Filed: Feb. 1, 2008

(65) Prior Publication Data
US 2008/0191270 A1     Aug. 14, 2008

(30) Foreign Application Priority Data
Feb. 9, 2007    (JP) .............................. 2007-030711

(51) Int. Cl.
*H01L 29/94* (2006.01)
(52) U.S. Cl. ................. 257/314; 257/315; 257/317; 257/320; 257/321; 257/E29.129
(58) Field of Classification Search ................. 257/314, 257/315, 317, 320, 321, E29.129
See application file for complete search history.

(56) References Cited

U.S. PATENT DOCUMENTS

2002/0070402 A1 * 6/2002 Ichige et al. ................. 257/296
2006/0077702 A1    4/2006 Sugimae et al.
2006/0279986 A1 * 12/2006 Suzuki ..................... 365/185.2

FOREIGN PATENT DOCUMENTS

KR    10-2004-0029525    4/2004

OTHER PUBLICATIONS

Notification of Reasons for Rejection issued by the Korean Patent Office on Oct. 26, 2009, for Korean Patent Application No. 10-2008-0008603, and English-language translation thereof.
English language translation of [Final] Notification of Reasons for Rejection issued by the Korean Patent Office on Apr. 1, 2010, for Korean Patent Application No. 10-2008-0008603.

* cited by examiner

*Primary Examiner*—Tan N Tran
(74) *Attorney, Agent, or Firm*—Finnegan, Henderson, Farabow, Garrett & Dunner, L.L.P.

(57) ABSTRACT

A NAND-type non-volatile semiconductor memory device has a semiconductor substrate, an element isolation insulating film which is formed on a surface of the semiconductor substrate spaced apart at a predetermined distance from each other, a first insulating film which is formed between the element isolation insulating films on the semiconductor substrate, a floating gate which is formed on the first insulating films, a second insulating gate which is formed on an end region of the floating gate, a control gate which is formed on the second insulating film, and a contact plug which is formed on a surface of the floating gate so that one end of the contact plug is electrically connected to the control gate.

19 Claims, 36 Drawing Sheets

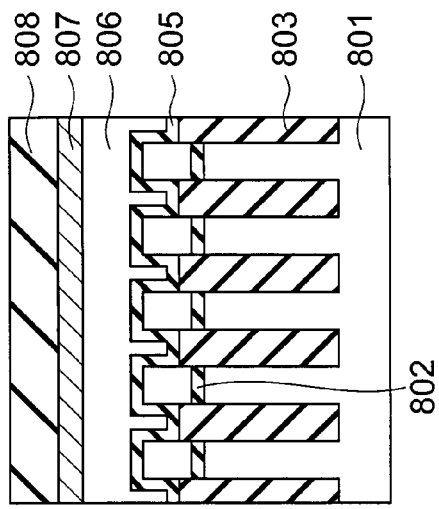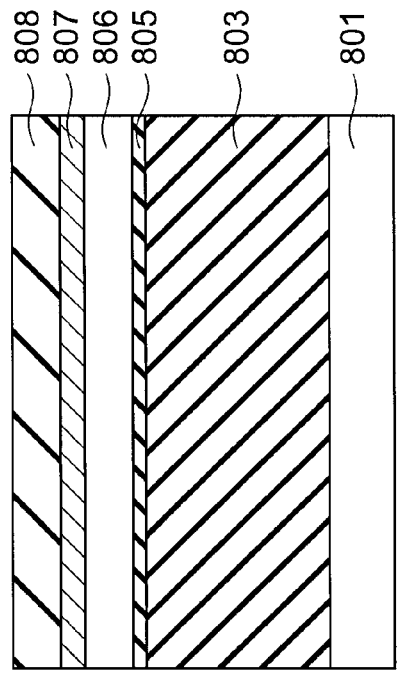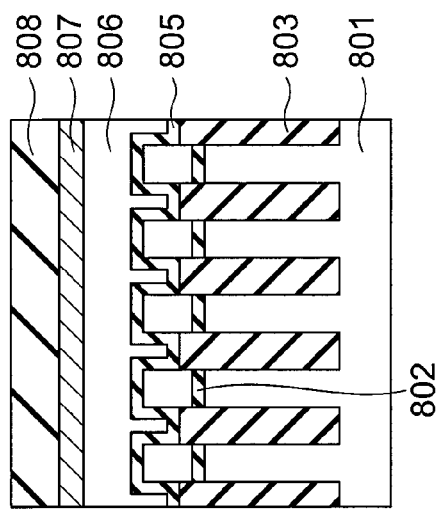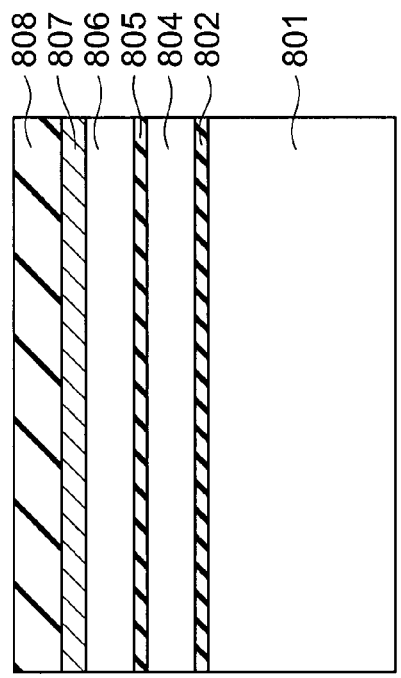
FIG. 9

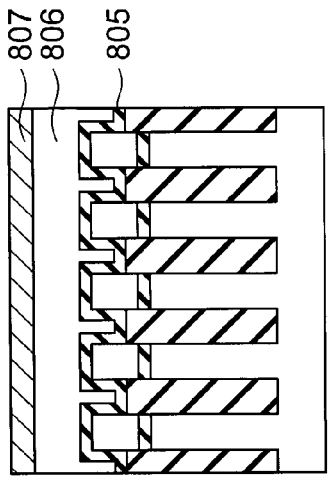
(d) FOURTH LONGITUDINAL SECTION
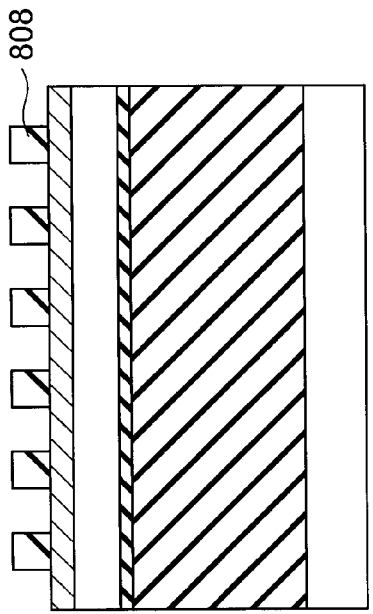
(f) SIXTH LONGITUDINAL SECTION
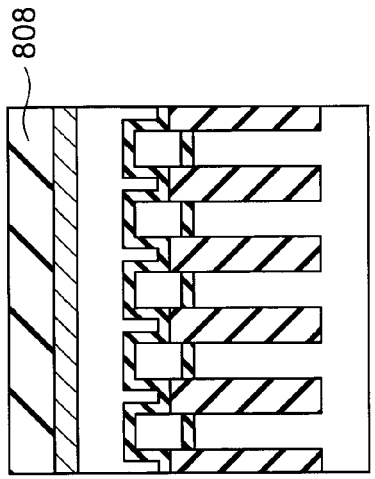
(c) THIRD LONGITUDINAL SECTION
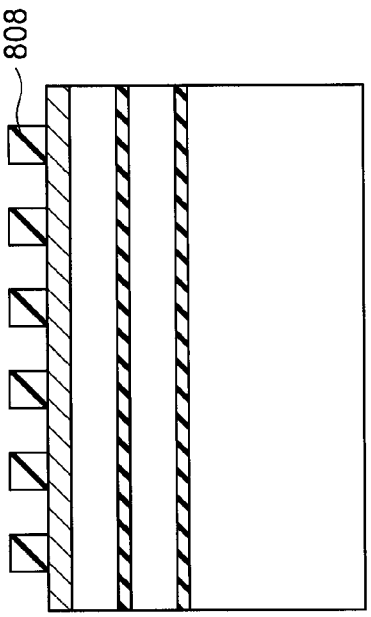
(e) FIFTH LONGITUDINAL SECTION
FIG. 13

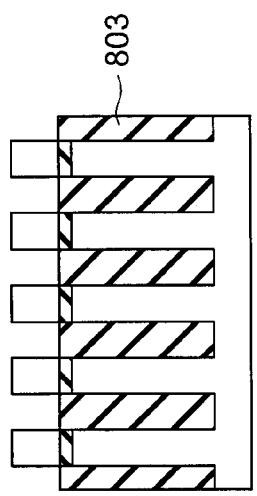
(d) FOURTH LONGITUDINAL SECTION
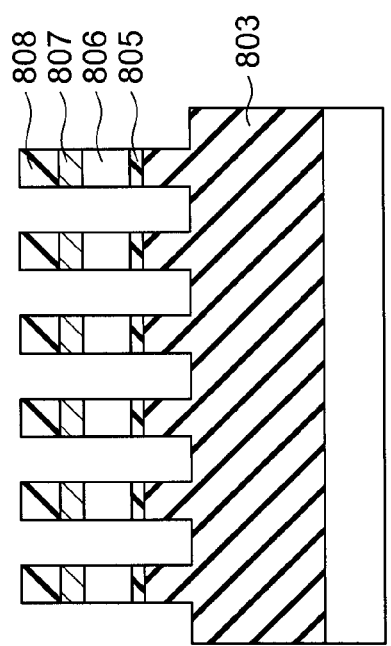
(f) SIXTH LONGITUDINAL SECTION
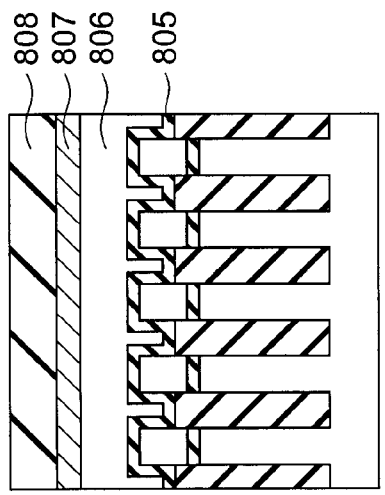
(c) THIRD LONGITUDINAL SECTION
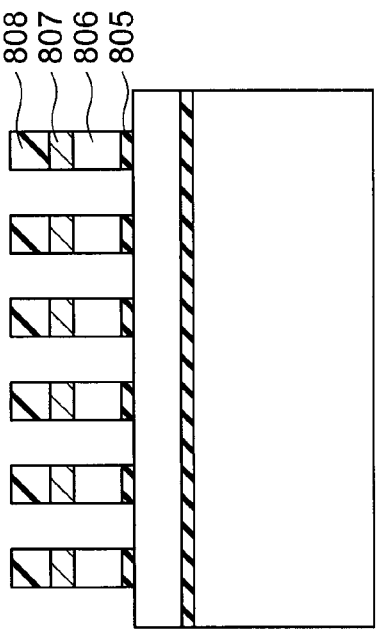
(e) FIFTH LONGITUDINAL SECTION
FIG. 17

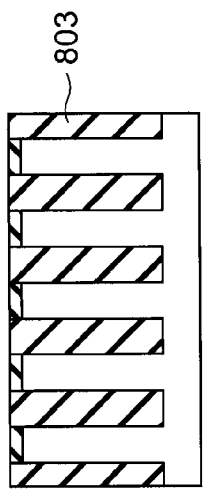
(d) FOURTH LONGITUDINAL SECTION
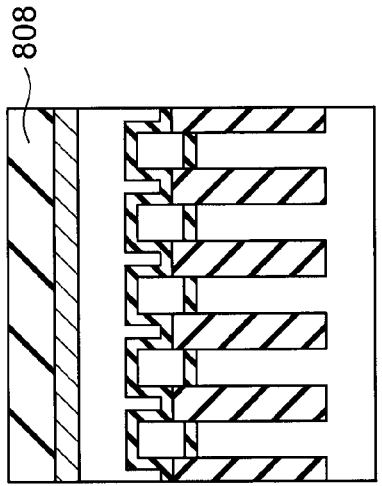
(c) THIRD LONGITUDINAL SECTION
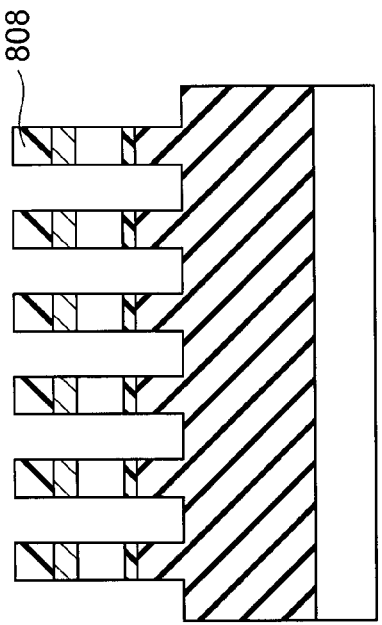
(f) SIXTH LONGITUDINAL SECTION
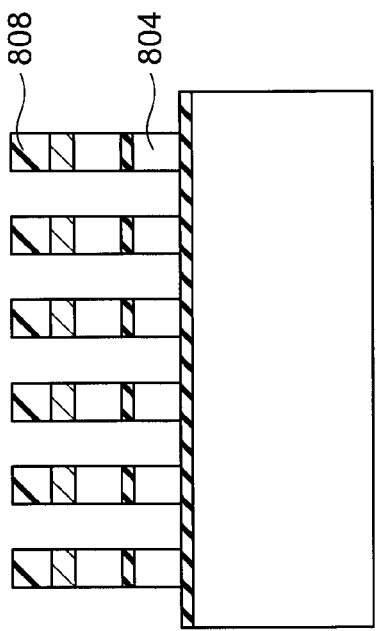
(e) FIFTH LONGITUDINAL SECTION
FIG. 19

(a) FIRST LONGITUDINAL SECTION (b) SECOND LONGITUDINAL SECTION

NAND-TYPE NON-VOLATILE SEMICONDUCTOR MEMORY DEVICE AND METHOD OF MANUFACTURING THE SAME

CROSS REFERENCE TO RELATED APPLICATIONS

This application is based upon and claims the benefit of priority from the prior Japanese Patent Application No. 2007-30711, filed on Feb. 9, 2007, the entire contents of which are incorporated herein by reference.

BACKGROUND OF THE INVENTION

The present invention relates to a NAND-type non-volatile semiconductor memory device and a method of manufacturing the same.

A NAND-type non-volatile semiconductor memory device (e.g., NAND-type flash memory) includes a word line having an end portion at which a plug is formed for a contact with wiring of an upper layer. The word line is also provided with a fringe in consideration of the misalignment during the formation of the contact plug.

Lithography technology is used for microfabrication in a high degree of integration of elements, by means of illumination method such as off axis illumination (oblique illumination). In the method, a luminous flux for exposure is incident in an oblique direction to a reticle (photomask) by placing an aperture at a position offset from the center of optical axis. The method is also called annular illumination or quasar illumination depending on the shape of aperture, and has an advantage of improved resolution and focal depth.

Dipole illumination technique provides high resolution in one direction. However, at the end of the word line having the fringe, the fringe breaks up the regularity of the structure, which leads to degraded resolution and insufficient margin for exposure. This may causes the fringe to be brought in contact with the adjacent word line, resulting in short-circuit between the word lines.

It is difficult to form fine fringes, and also an addition of another lithography step for forming a fringe increases manufacturing cost. Therefore, it is desired to form a contact plug with the end of a word line being formed in a straight line shape without a fringe.

In forming a contact plug at an end of a word line, it is advantageous to process the contact plug and a contact hole which is formed in a substrate in a peripheral circuit at the same time, in terms of manufacturing cost. The contact hole of the peripheral circuit has a depth greater than that of a memory region.

So, if a contact hole of a memory region is formed under the etching condition for making a contact hole of a peripheral circuit, the former contact hole is excessively etched, and reaches the substrate. A plug provided in the contact hole causes a problem: that is, the plug conducts electricity to the substrate, which results in a short-circuit fault.

SUMMARY OF THE INVENTION

According to one aspect of the present invention, there is provided a NAND-type non-volatile semiconductor memory device, comprising:

a semiconductor substrate;

an element isolation insulating film which is formed on a surface of the semiconductor substrate spaced apart at a predetermined distance from each other;

a first insulating film which is formed between the element isolation insulating films on the semiconductor substrate;

a floating gate which is formed on the first insulating films;

a second insulating gate which is formed on an end region of the floating gate;

a control gate which is formed on the second insulating film; and a contact plug which is formed on a surface of the floating gate so that one end of the contact plug is electrically connected to the control gate.

According to one aspect of the present invention, there is provided a NAND-type non-volatile semiconductor memory device, comprising:

a semiconductor substrate;

a plurality of element isolation insulating films which are formed in the shape of strips spaced apart at a predetermined distance from each other on a surface of the semiconductor substrate along a column direction;

a first insulating film which is formed along the column direction in the shape of strips between the element isolation insulating films on the semiconductor substrate;

a plurality of floating gates which are formed on the first insulating film spaced apart at a predetermined distance from each other;

a plurality of second insulating films which are formed spaced apart at a predetermined distance from each other to span the element isolation insulating films on the floating gate along a row direction that is orthogonal to the column direction;

a control gate which is formed on the second insulating film along the row direction in the shape of strip; and a contact plug which is in contact with the upper and side surfaces of the control gate, wherein the floating gate below the contact plug has a length in the column direction which is greater than that of the control gate in the column direction, and a lower surface of the contact plug contacts with an upper surface of the floating gate.

According to one aspect of the present invention, there is provided a method for manufacturing a NAND-type non-volatile semiconductor memory device, comprising:

forming a first insulating film on a semiconductor substrate;

forming a first electrode layer on the first insulating film;

forming grooves spaced apart at a predetermined distance from each other by etching the first electrode layer, the first insulating film, and the semiconductor substrate along a first direction;

forming element isolation insulating films so that the grooves are filled;

forming a second insulating film on the first electrode layer and the element isolation insulating film;

forming a second electrode layer on the second insulating film;

forming a third insulating film on the second electrode layer;

forming word lines spaced apart at a predetermined distance from each other by etching the third insulating film, the second electrode layer, and the second insulating film along a second direction that is orthogonal to the first direction;

forming a resist on the word line and the first electrode layer in a predetermined region;

etching the first electrode layer using the resist and the third insulating film as a mask;

removing the resist;

forming a fourth insulating film between the word lines;

forming a fifth insulating film on the word line, the fourth insulating film, and the first electrode layer in the predetermined region;

forming an interlayer insulating film on the fifth insulating film;

making a contact hole by etching the interlayer insulating film, the fifth insulating film, the third insulating film, the second electrode layer, and the second insulating film so that an upper surface of the second electrode layer and an upper surface of the first electrode layer in the predetermined region are exposed; and forming a contact plug in the contact hole.

BRIEF DESCRIPTION OF THE DRAWINGS

FIG. 9 is a sectional view illustrating one step of a method for manufacturing a NAND-type non-volatile semiconductor memory device according to the embodiment;

FIG. 13 is a sectional view subsequent to FIG. 11;
FIG. 17 is a sectional view subsequent to FIG. 15;
FIG. 19 is a sectional view subsequent to FIG. 17.

DESCRIPTION OF THE EMBODIMENTS

Now, a NAND-type non-volatile semiconductor memory device according to an embodiment of the present invention will be explained below with reference to the drawings.

Figure 1:
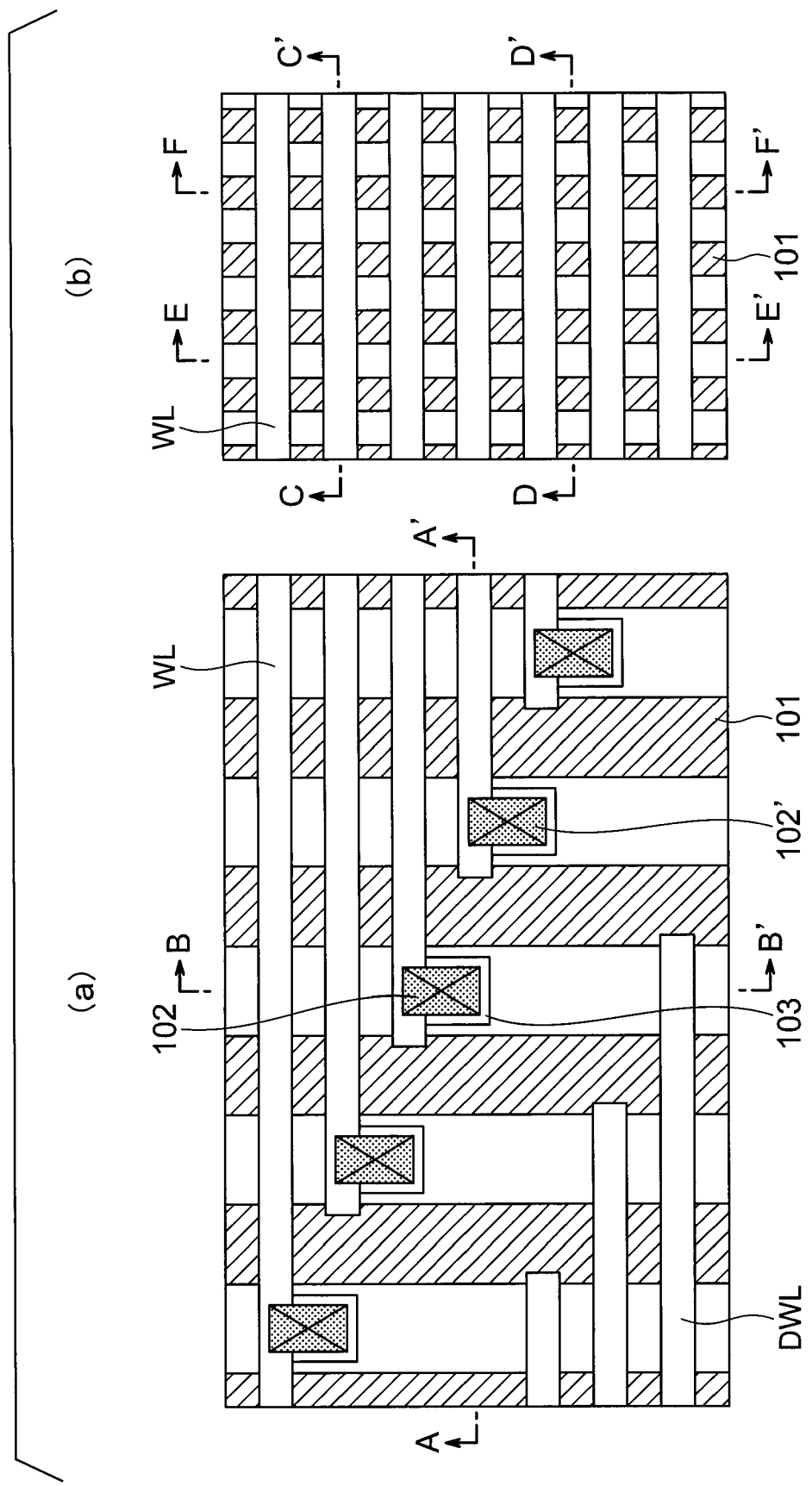
FIG. 1 is a view showing an upper surface of a NAND-type non-volatile semiconductor memory device according to an embodiment of the present invention.

FIGS. 1 is a view showing an upper surface of a NAND-type non-volatile semiconductor memory device according to an embodiment of the present invention: FIG. 1(a) shows an end portion of a memory cell array; and FIG. 1(b) shows an upper surface of a central region of the memory cell array.

The NAND-type non-volatile semiconductor memory device includes: element isolation insulating films 101 which are formed along a first direction (in the vertical direction in FIG. 1, that is, a column direction) spaced apart at a predetermined distance from each other; word lines WL and dummy word lines DWL which are formed along a second direction that is orthogonal to the first direction (in the lateral direction in FIG. 1, that is, a row direction) spaced apart at a predetermined distance from each other; contact plugs 102 which are formed to be engaged in the end portions of the word lines WL; and polysilicon films 103 for receiving the contact plugs 102.

Each of the end portions of word lines WL is formed in a straight line shape. The adjacent word lines WL have different lengths individually, and the contact plugs 102 are formed not to engage against the adjacent word lines WL.

The dummy word lines DWL are provided to maintain the regular structure of the word lines WL at the end portions of the word lines WL in consideration of the feature of lithography technology that yields high resolution to a regular pattern.

The central region of the memory cell array has a configuration similar to that of a general NAND-type non-volatile semiconductor memory device.

Figure 2:
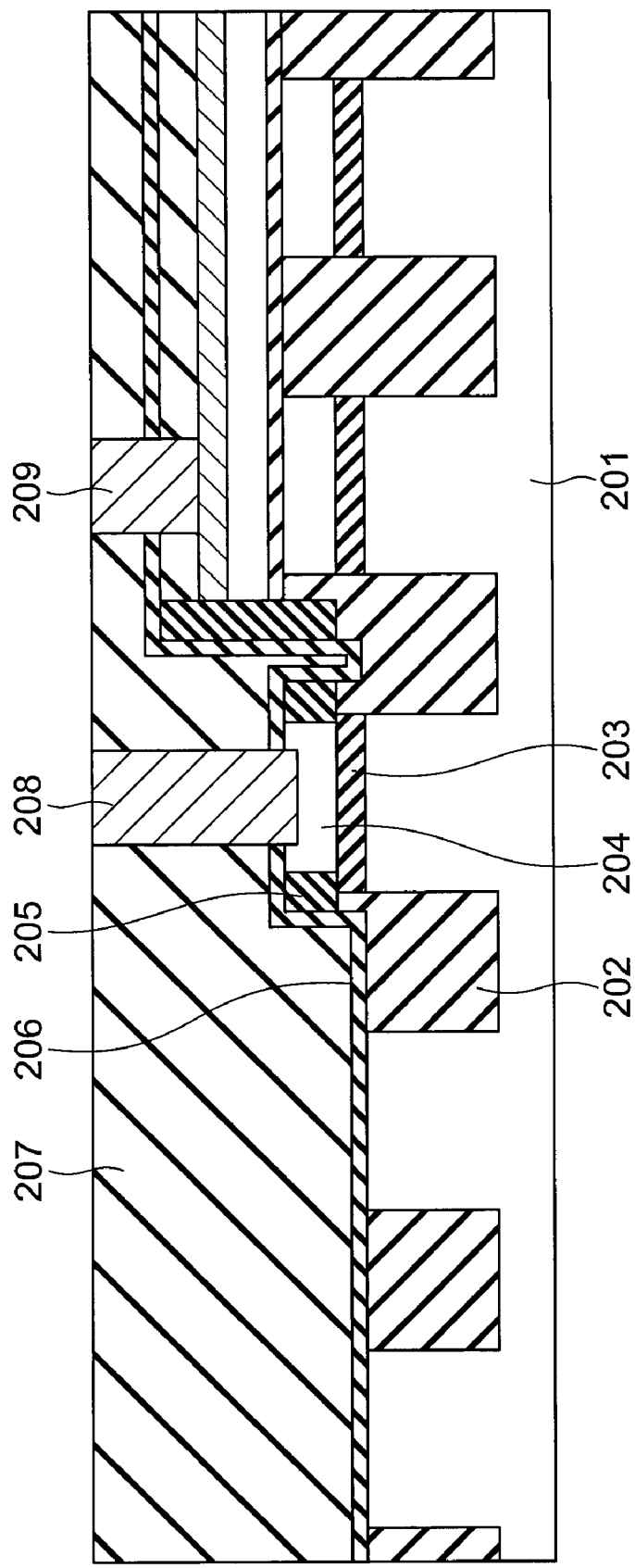
FIG. 2 is a longitudinal sectional view of the NAND-type non-volatile semiconductor memory device according to the embodiment.
Figure 3:
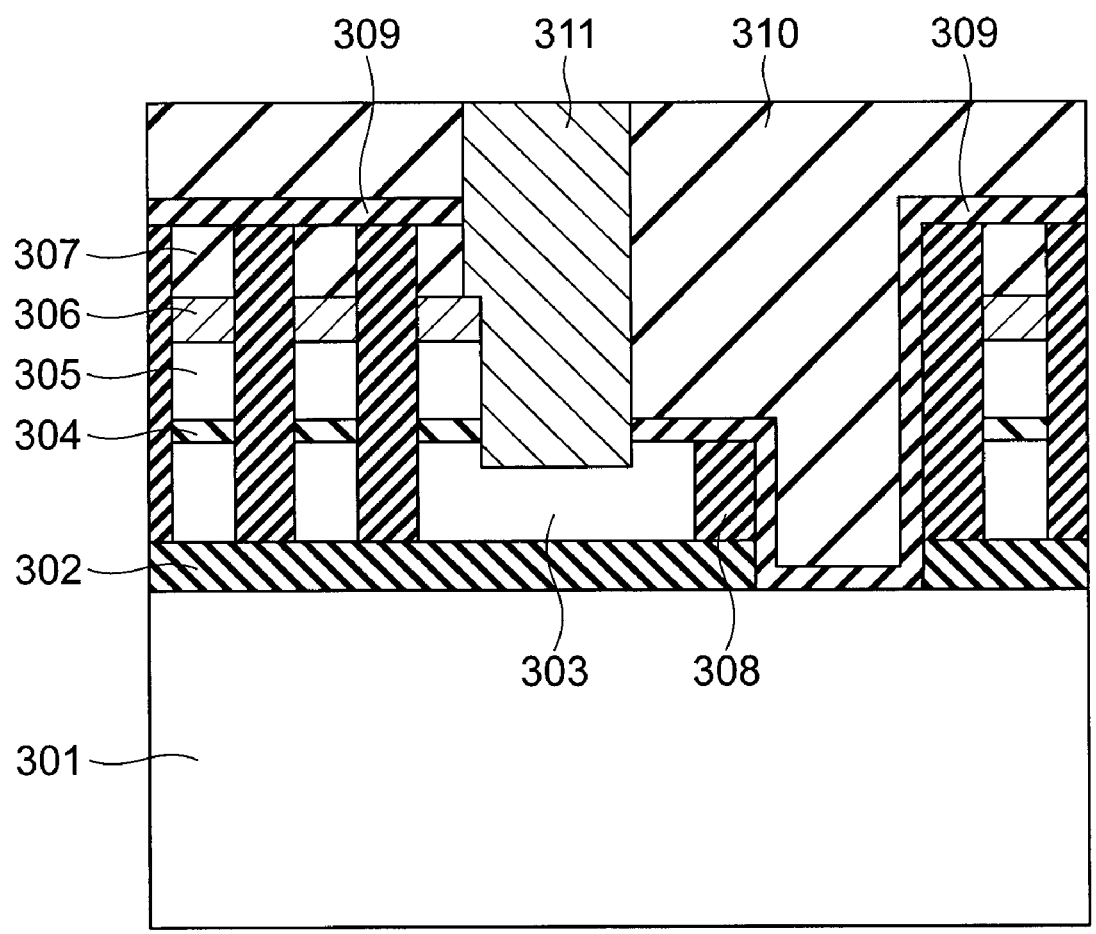
FIG. 3 is a longitudinal sectional view of the NAND-type non-volatile semiconductor memory device according to the embodiment.
Figure 4:
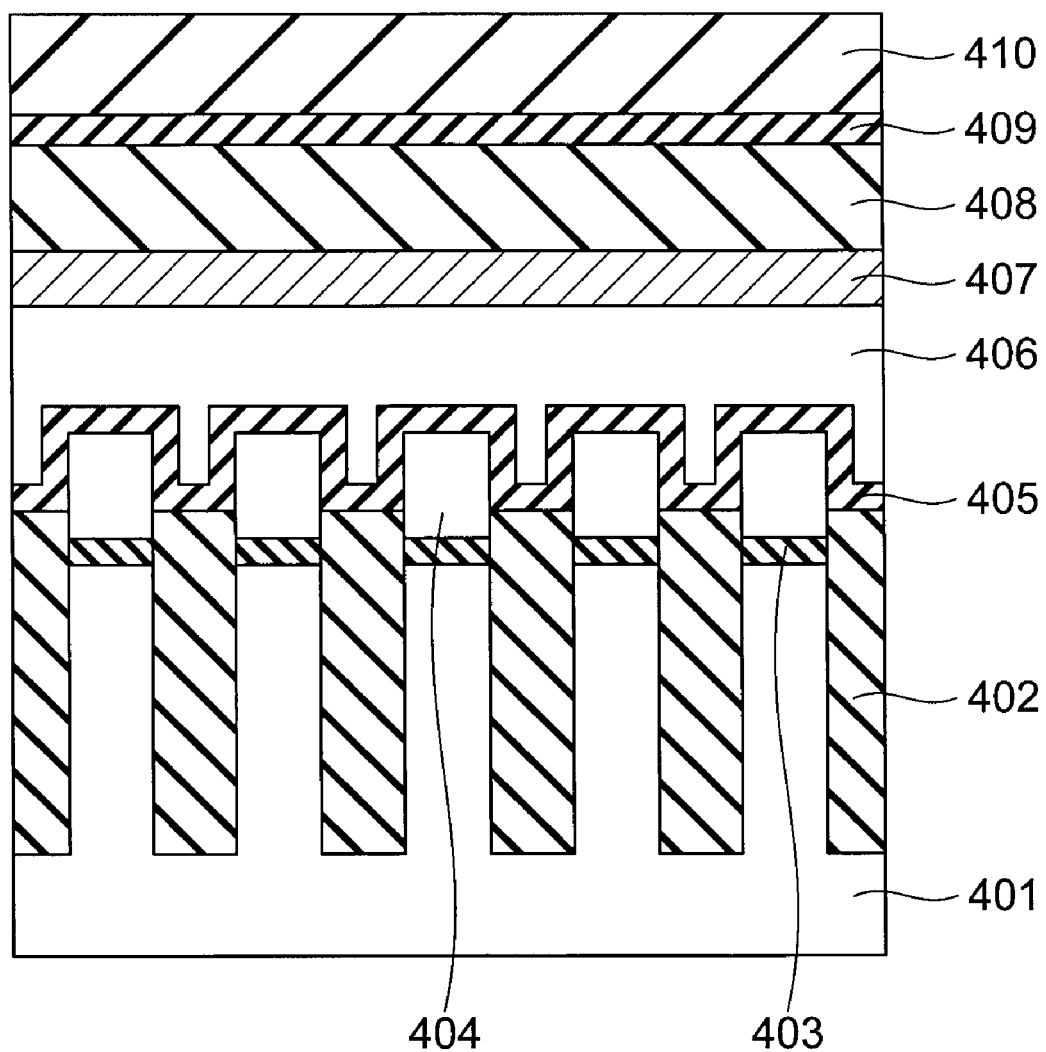
FIG. 4 is a longitudinal sectional view of the NAND-type non-volatile semiconductor memory device according to the embodiment.
Figure 5:
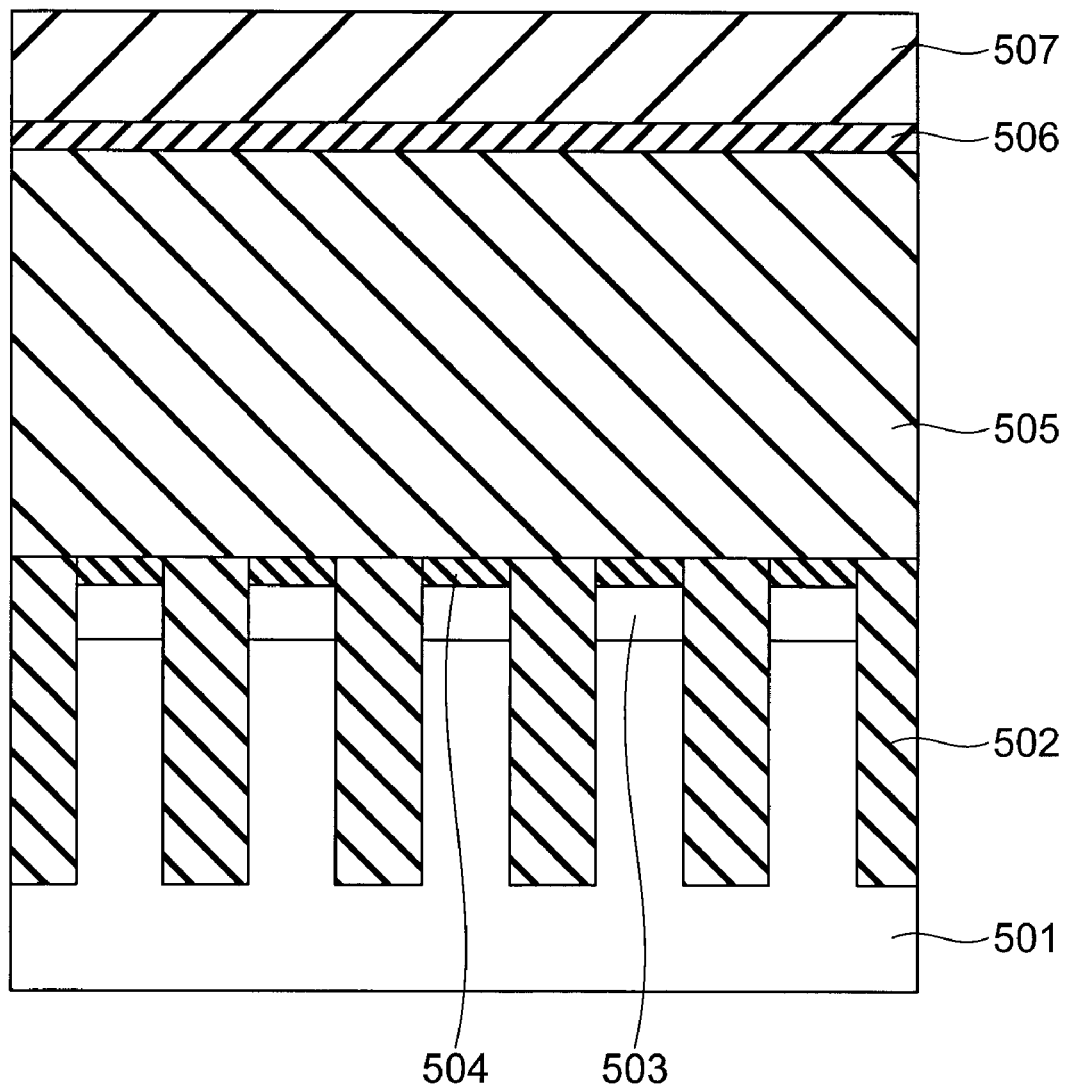
FIG. 5 is a longitudinal sectional view of the NAND-type non-volatile semiconductor memory device according to the embodiment.
Figure 6:
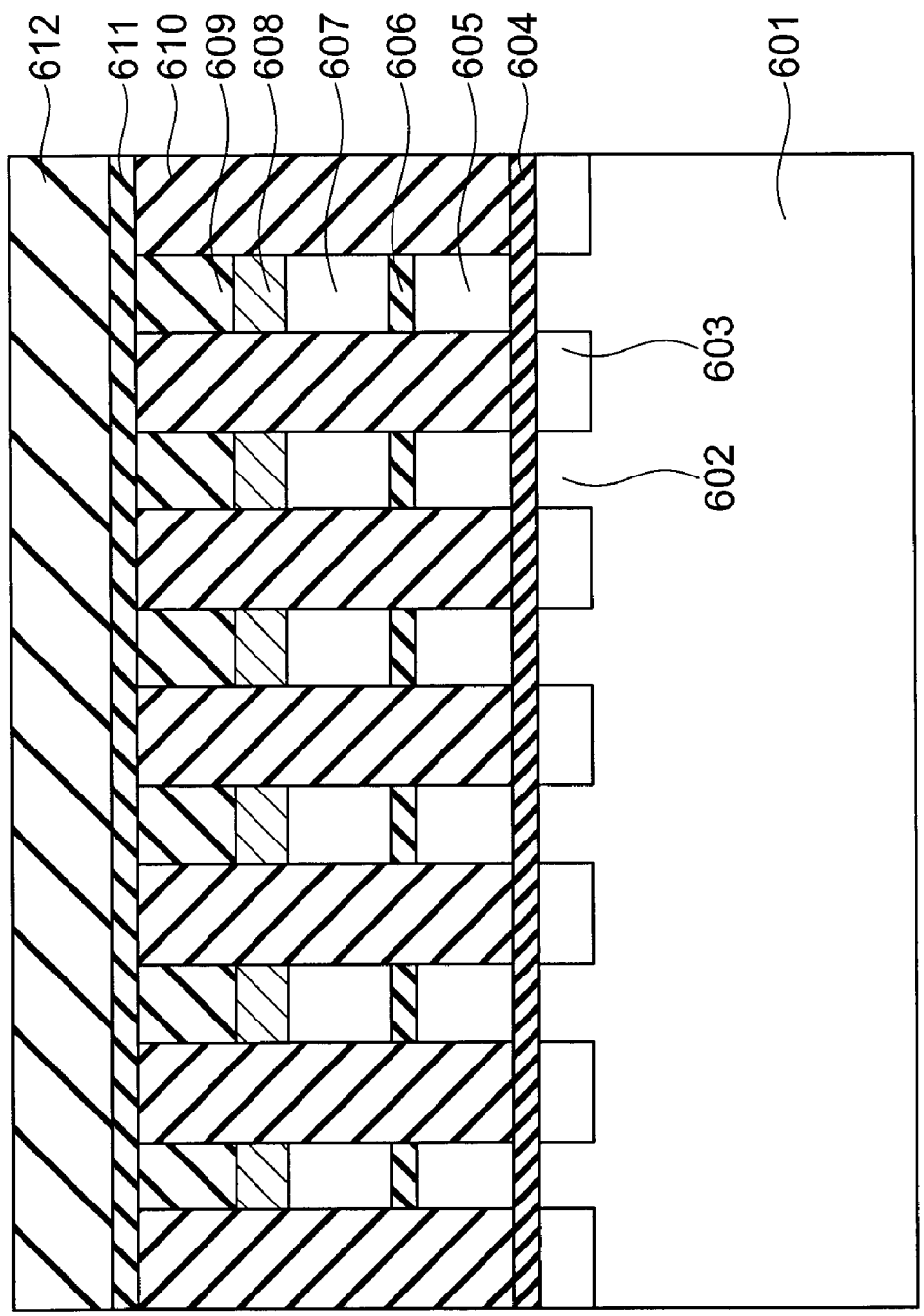
FIG. 6 is a longitudinal sectional view of the NAND-type non-volatile semiconductor memory device according to the embodiment.
Figure 7:
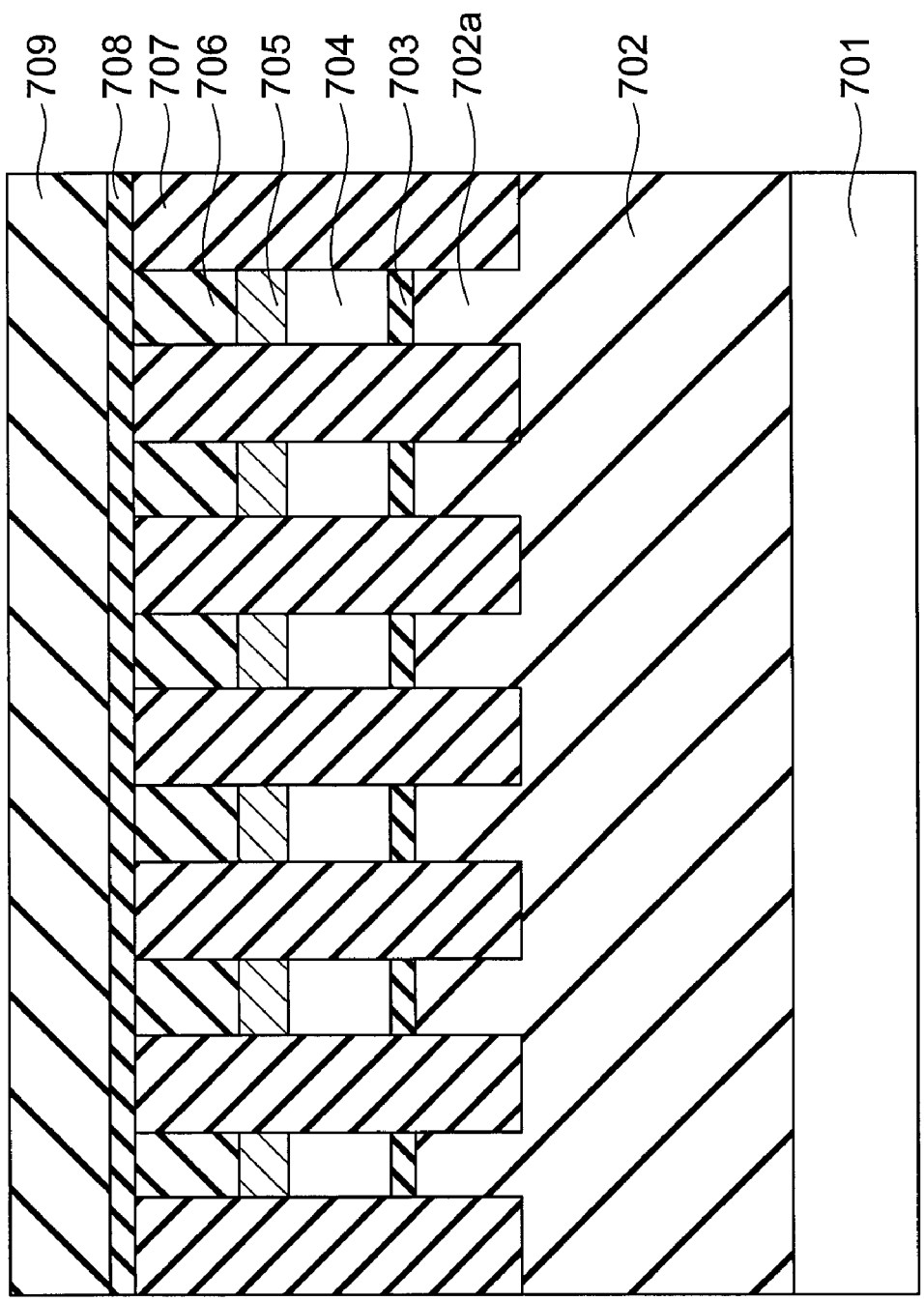
FIG. 7 is a longitudinal sectional view of the NAND-type non-volatile semiconductor memory device according to the embodiment.

FIG. 2 is a longitudinal sectional view (a first longitudinal section along the second direction) taken along the line A-A' shown in FIG. 1; FIG. 3 is a longitudinal sectional view (a second longitudinal section along the first direction) taken along the line B-B' shown in FIG. 1; FIG. 4 is a longitudinal sectional view (a third longitudinal section along the second direction) taken along the line C-C' shown in FIG. 1; FIG. 5 is a longitudinal sectional view (a fourth longitudinal section along the second direction) taken along the line D-D' shown in FIG. 1; FIG. 6 is a longitudinal sectional view (a fifth longitudinal section along the first direction) taken along the line E-E' shown in FIG. 1; and FIG. 7 is a longitudinal sectional view (a sixth longitudinal section along the first direction) taken along the line F-F' shown in FIG. 1.

First, referring to FIG. 2, the structure of an end portion of a memory cell array will be explained below. A silicon substrate 201 is provided with element isolation insulating films 202 (which correspond to the element isolation insulating film 101 of FIG. 1) formed thereon spaced apart at a predetermined distance from each other, and a gate insulating film 203 which is formed on the silicon substrate 201 between the element isolation insulating films 202.

The gate insulating film 203 is provided with a polysilicon film 204 formed thereon, and the polysilicon film 204 is provided with spacers 205 on the sides thereof. The gate insulating film 203 is formed to have a gate insulating film structure having a large film thickness for a high voltage resistant system peripheral circuit.

A silicon nitride film 206 is formed to cover the silicon substrate 201, the element isolation insulating films 202, the polysilicon film 204, and the spacers 205, and on the silicon nitride film 206, an interlayer insulating film 207 is formed. On the polysilicon film 204, a contact plug 208 (which corresponds to contact plug 102 in FIG. 1) is formed through the interlayer insulating film 207 and the silicon nitride film 206.

A contact plug 209 is the contact plug (which corresponds to the contact plug 102' in FIG. 1) which is engaged in the word line adjacent to the word line the contact plug 208 is engaged in.

Referring to FIG. 3, the structure of an end of the memory cell array will be explained below. A gate insulating film 302 is formed on a silicon substrate 301. On the gate insulating film 302, a polysilicon film 303, an interpoly insulating film 304, a polysilicon film 305, a tungsten silicide film 306, and a silicon nitride film 307 are formed at a predetermined distance from each other. The gate insulating film 302 is formed to have a gate insulating film structure having a large film thickness for a peripheral circuit.

The polysilicon film 303 serves as a floating gate (which is formed in the same step for forming a floating gate at the central region of the memory cell array, and does not operate as an element), and the polysilicon film 305 and the tungsten silicide film 306 serve as control gates.

On the sides of the gate structure, spacers (interlayer insulating films) 308 are formed. A silicon nitride film 309 is formed to cover the silicon substrate 301, the spacers 308, and silicon nitride film 307, and on the silicon nitride film 309 an interlayer insulating film 310 is formed.

A contact plug 311 (which corresponds to contact plug 102 in FIG. 1 and the contact plug 208 in FIG. 2) is formed to be in contact with the control gates 305, 306 and the floating gate 303, through the interlayer insulating film 310, and the silicon nitride films 309 and 307. The configuration allows the contact plug 311 to conduct electricity to the control gate (word line).

The polysilicon film 303 below the contact plug 311 is formed to have a size larger than those of other polysilicon films 303 so as to receive the contact plug 311.

Referring to FIG. 4 which shows a longitudinal section taken along the line C-C' in FIG. 1, the structure of the central region of the memory cell array will be explained below. A silicon substrate 401 has element isolation insulating films 402 which are buried in the silicon substrate 401 spaced apart at a predetermined distance from each other to be projected from the upper surface of the silicon substrate 401, and on the sandwiched portions of the silicon substrate 401 by the element isolation insulating films 402 a gate insulating film 403 is formed.

On the gate insulating film 403, a polysilicon film 404 is formed to serve as a floating gate. An interpoly insulating film 405 is formed so as to cover the element isolation insulating films 402 and the polysilicon film 404. The interpoly insulating film 405 has a convex-concave shape following the shapes of the underlying layers, i.e. element isolation insulating films 402 and the polysilicon films 404.

On the interpoly insulating film 405 a polysilicon film 406 and a tungsten silicide film 407 which serve as control gates are formed. The polysilicon film 406 has a lower surface which has a convex-concave shape following the shape of the underlying interpoly insulating film 405. On the tungsten silicide film 407, silicon nitride films 408, 409 and an interlayer insulating film 410 are formed in order.

Next, referring to FIG. 5 which shows a longitudinal section taken along the line D-D' in FIG. 1, the structure of the central region of the memory cell array will be explained below. A silicon substrate 501 has element isolation insulating films 502 formed therein at a predetermined distance from each other, and on the surface portions of the silicon substrate 501 between the element isolation insulating films 502 a dispersing layer 503 is formed.

On the dispersing layer 503, a gate insulating film 504 is formed, and on the gate insulating film 504 and the element isolation insulating film 502, an interlayer insulating film 505, a silicon nitride film 506, and an interlayer insulating film 507 are laminated in order.

Referring to FIG. 6 which shows a longitudinal section taken along the line E-E' in FIG. 1, the structure of the central region of the memory cell array will be explained below. On the surface of a silicon substrate 601 dispersing layers 603 are formed to have upper surfaces at the same level as that of the silicon substrate 601 and so as to sandwich channel regions 602 therebetween.

On the silicon substrate 601, a gate insulating film 604 is formed, and on the gate insulating film 604 above the channel regions 602, a polysilicon films 605 which serves as a floating gate, an interpoly insulating film 606, a polysilicon film 607 and a tungsten silicide film 608 which serve as control gates, and a silicon nitride film 609 are laminated in order.

On the sides of the gate structure, interlayer insulating films 610 are to be formed, and a silicon nitride film 611 is to be formed on the interlayer insulating films 610 and the silicon nitride films 609. On the silicon nitride film 611 an interlayer insulating film 612 is to be formed.

Referring to FIG. 7 which shows a longitudinal section taken along the line F-F' in FIG. 1, the structure of the central region of the memory cell array will be explained below. A silicon substrate 701 has an element isolation insulating film 702 formed thereon. The upper surface of the element isolation insulating film 702 has a convex-concave shape, and on the convex portions 702a, an interpoly insulating film 703, a polysilicon film 704, a tungsten silicide film 705, and a silicon nitride film 706 are laminated in order.

On the concave portions, interlayer insulating films 707 are formed, and on the interlayer insulating films 707 and the silicon nitride films 706 a silicon nitride film 708 is to be formed. On the silicon nitride film 708 an interlayer insulating film 709 is to be formed.

As described above, the NAND-type non-volatile semiconductor memory device according to the present embodiment includes word lines WL having the ends formed in a straight line shape, which is preferable for a processing by lithography technology that yields high resolution using a specific light in one direction.

In addition, the gate insulating films 203 and 302 below the contact plugs 208 and 311 have a gate insulating film structure having a large film thickness for a peripheral circuit, which prevents a breaking of an insulating film due to processing damage during the formation of a contact hole.

When the contact hole is made simultaneously with a contact hole in the substrate of the peripheral circuit under the same etching condition, at the peripheral circuit, a deeper hole is made in the interlayer insulating film in the peripheral circuit compared to that at the end of the word line, but the silicon nitride films 206, 307 and 309 and the polysilicon films 204, 303 function as stoppers are present at the end of the word line WL to be able to prevent the hole from reaching the silicon substrates 201 and 301. Thus, the conduction of electricity between the contact plug and the substrate can be prevented, which provides a NAND-type non-volatile semiconductor memory device at high degree of integration and high process yield.

Next, referring to the sectional views of FIG. 8 to FIG. 29 illustrating a process flow, a method for manufacturing a NAND-type non-volatile semiconductor memory device will be explained below. The sectional views illustrating a process flow show first to sixth longitudinal sections which correspond to FIG. 2 to FIG. 7 respectively at the same steps.

That is, the first longitudinal section shows the longitudinal section at an end of a memory cell array (word line) along a second direction; the second longitudinal section shows the longitudinal section at the end of the memory cell array (word line) along a first direction; the third longitudinal section shows the longitudinal section at the central region of a memory cell array along a word line (second direction); the fourth longitudinal section shows the longitudinal section at the central region of the memory cell array (word line) along a second direction between word lines; the fifth longitudinal section shows the longitudinal section at the central region of the memory cell array along a first direction between element isolation insulating films; and the sixth longitudinal section shows the longitudinal section at the central region of the memory cell array along an element isolation insulating film (first direction).

Figure 28:
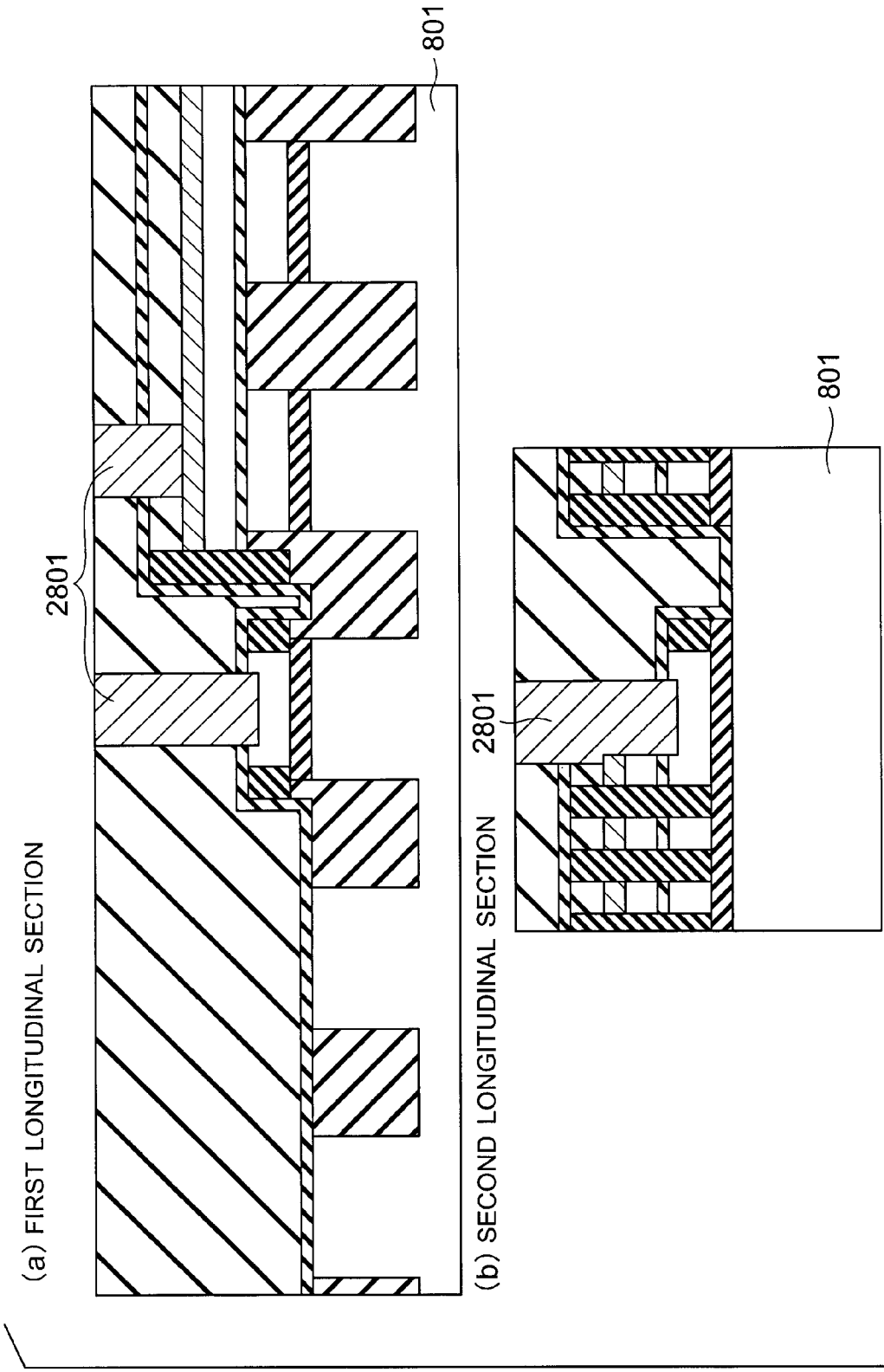
FIG. 28 is a sectional view subsequent to FIG. 26.
Figure 29:
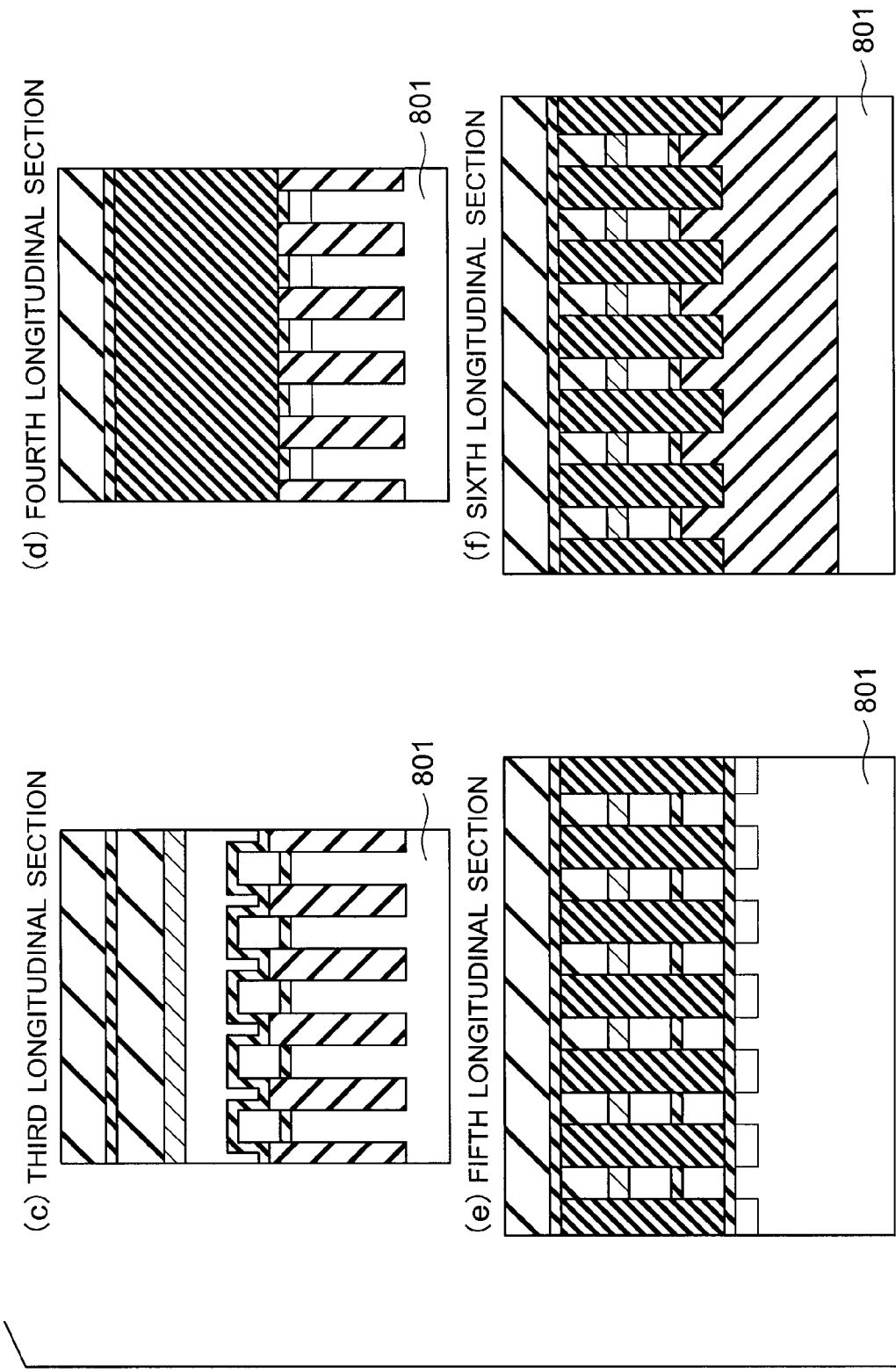
FIG. 29 is a sectional view subsequent to FIG. 27.

FIGS. 8, 10, 12, and 14 to 28 show the first and second longitudinal sections; and FIG. 9 and FIGS. 11, 13 and 15 to 29 show the third to sixth longitudinal sections. The pair of FIGS. 8 and 9, the pair of FIGS. 10 and 11, the pair of FIGS. 12 and 13, the pair of FIGS. 14 and 15 . . . and the pair of FIGS. 28 and 29 show the same steps respectively.

Figure 8:
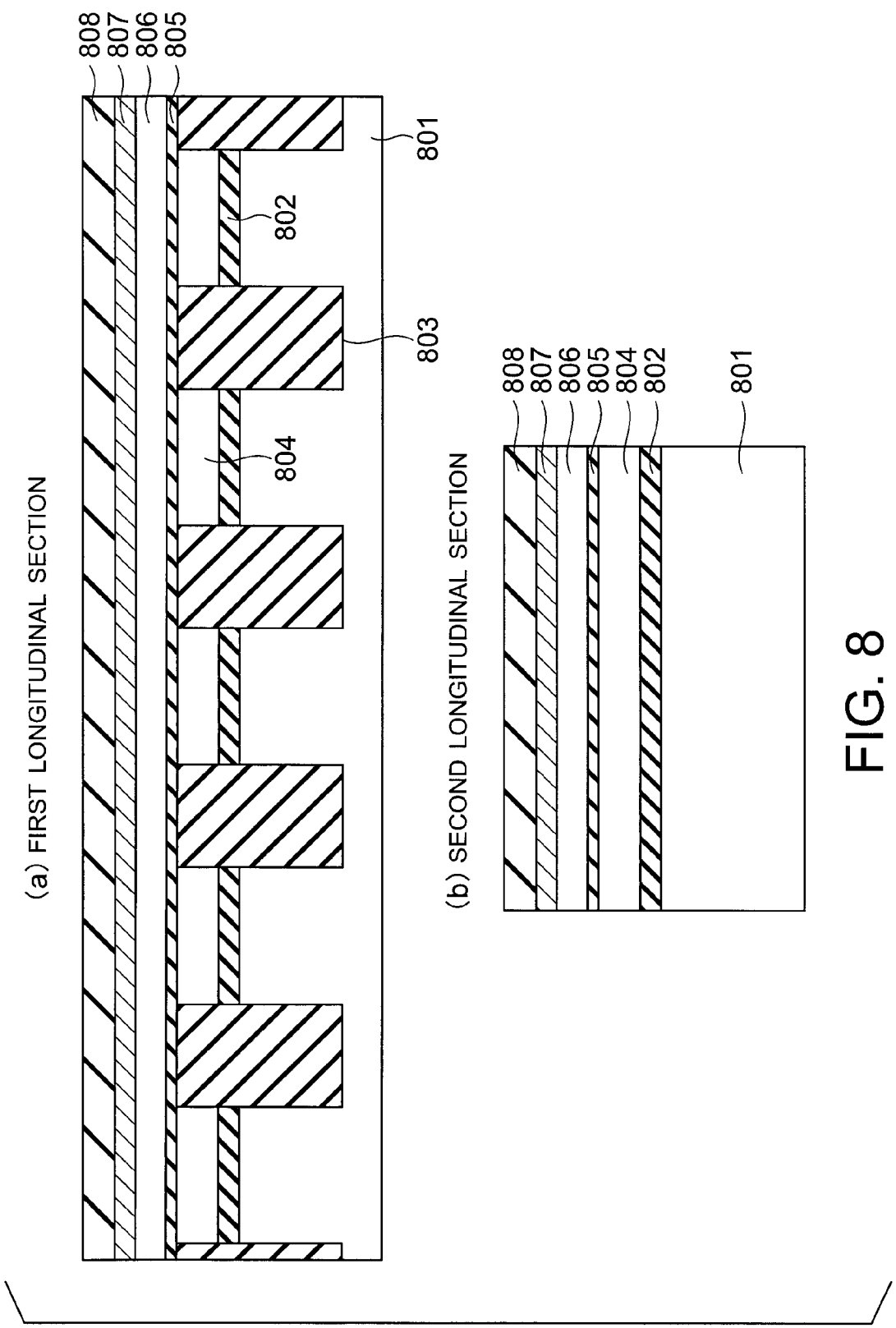
FIG. 8 is a sectional view illustrating one step of a method for manufacturing a NAND-type non-volatile semiconductor memory device according to the embodiment.

As shown in FIG. 8 and FIG. 9, using a know technology, a gate insulating film 802 which is for example a silicon dioxide film and a polysilicon film 804 are deposited on a silicon substrate 801 by CVD (chemical vapor deposition) technique. Then, the silicon substrate 801, the gate insulating film 802 and the polysilicon films 804 are etched by anisotropic etching such as RIE (reactive ion etching) to form grooves spaced apart at a predetermined distance from each other along the first direction.

Element isolation insulating films 803 which are for example silicon dioxide films are formed so as to fill the grooves, and an interpoly insulating film 805 which is for example an ONO film is formed so as to cover the element isolation insulating films 803 and the polysilicon film 804.

In addition, a polysilicon film 806 is formed on the interpoly insulating film 805, and a tungsten silicide film 807 is formed on the upper portion of the polysilicon film 806, and a silicon nitride film 808 is formed on the tungsten silicide film 807. The gate insulating film 802 at the end of the memory cell array is formed to have a large film thickness for a high voltage resistant transistor in a peripheral circuit.

Figure 10:
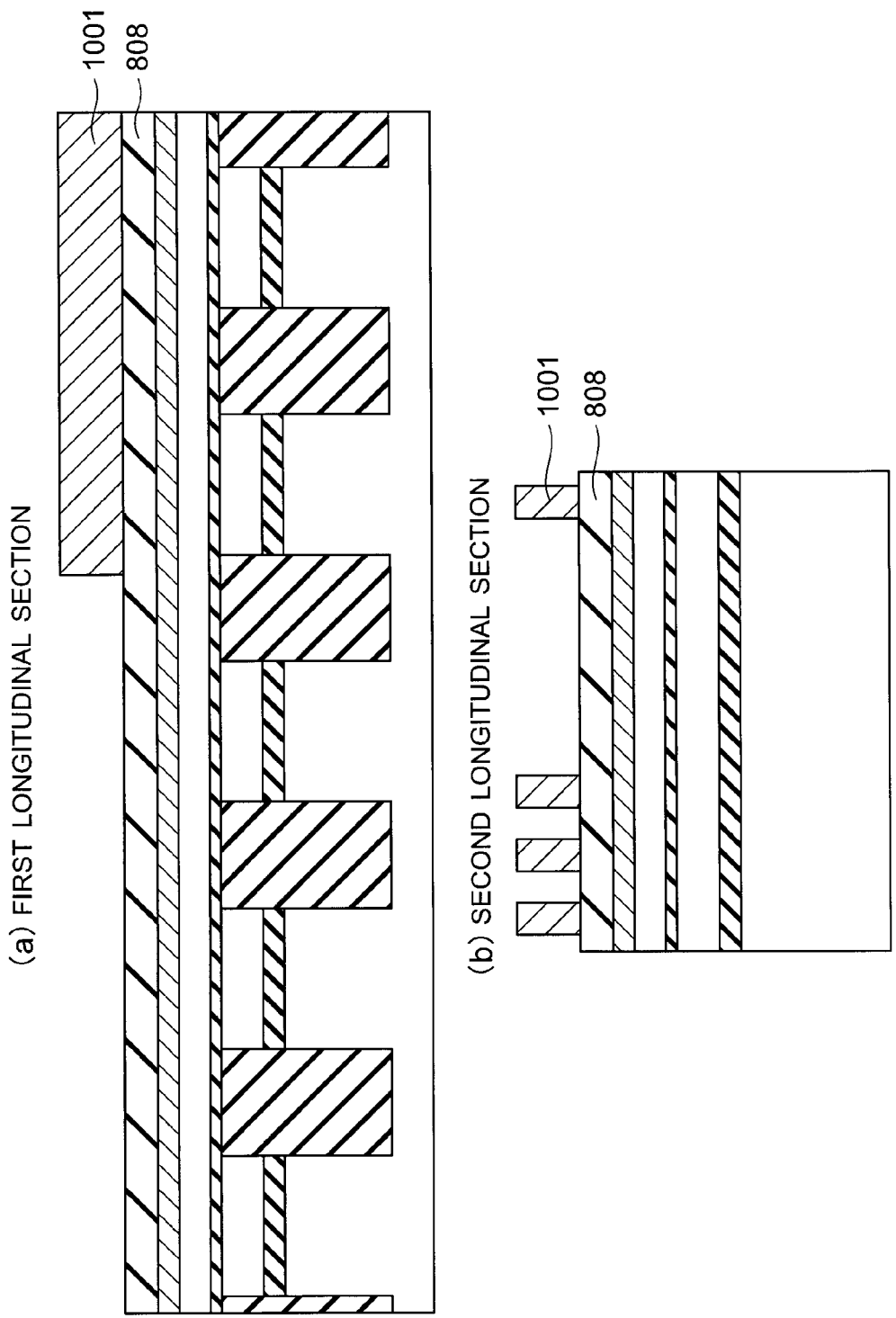
FIG. 10 is a sectional view subsequent to FIG. 8.
Figure 11:
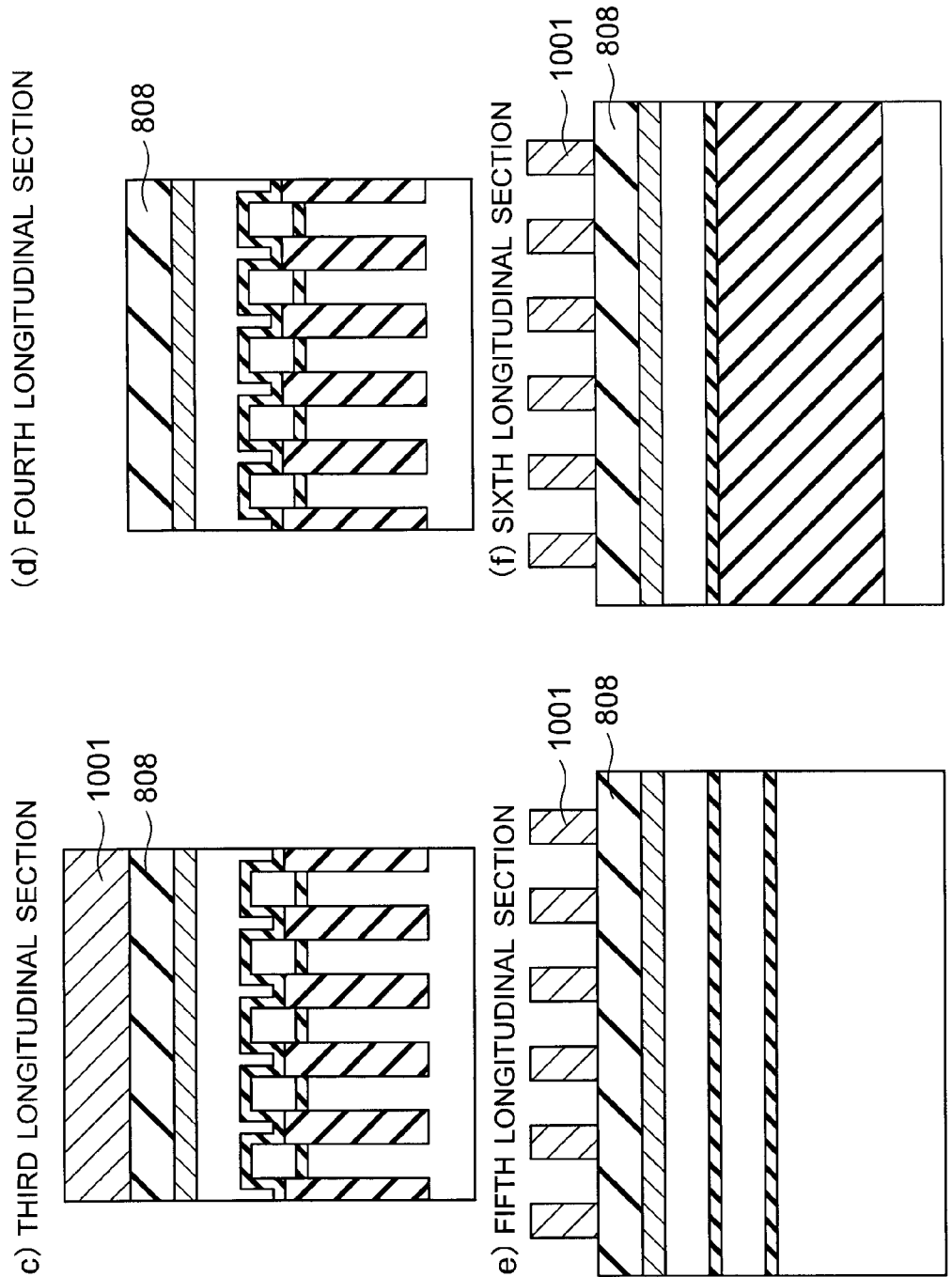
FIG. 11 is a sectional view subsequent to FIG. 9.

As shown in FIG. 10 and FIG. 11, the silicon nitride film 808 is coated with a photoresist 1001 which is processed by lithography technology to be in the shape of strips along the second direction spaced apart at a predetermined distance from each other.

Figure 12:
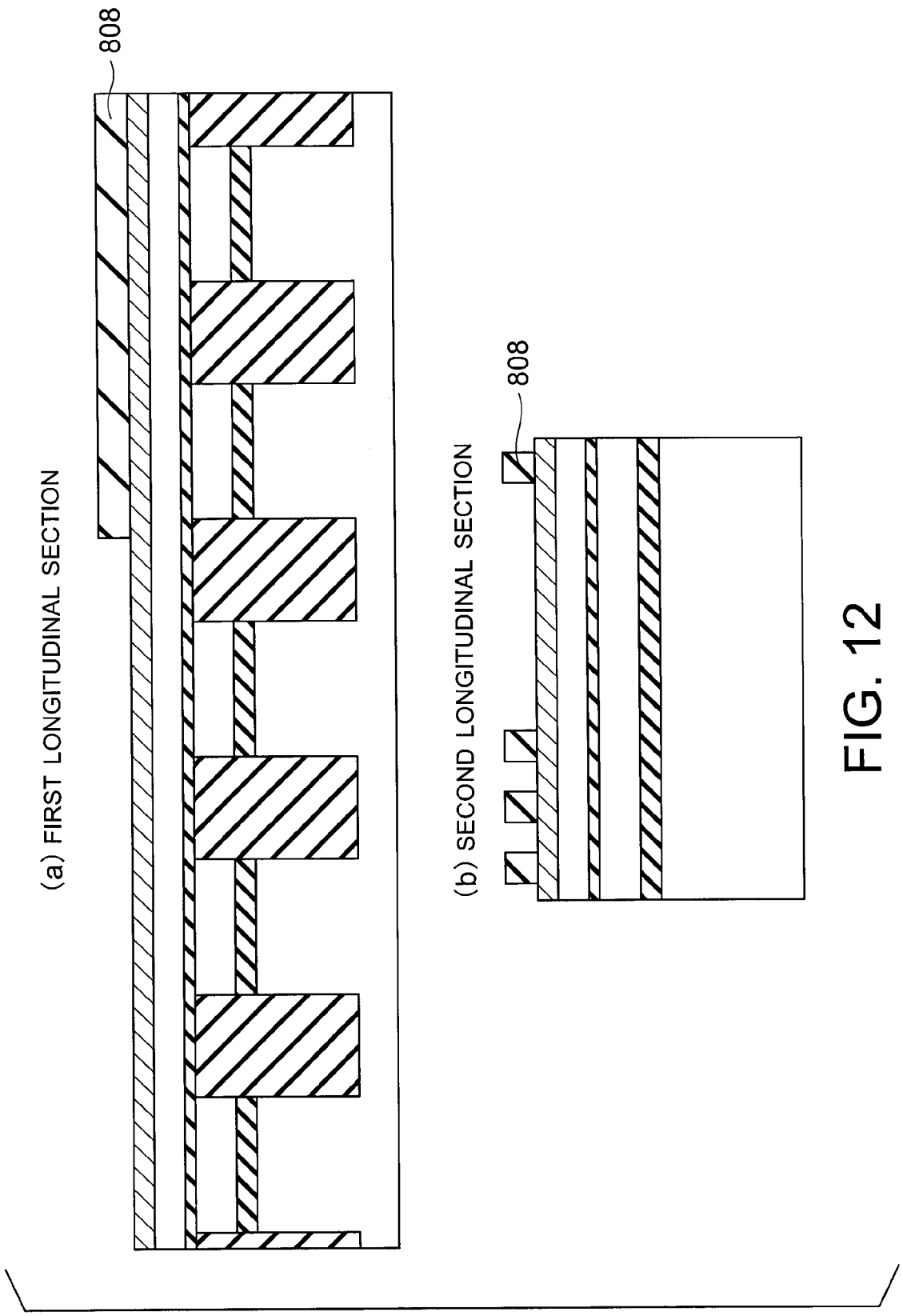
FIG. 12 is a sectional view subsequent to FIG. 10.

As shown in FIG. 12 and FIG. 13, the patterned photoresist 1001 is used as a mask to process the silicon nitride film 808 by RIE (reactive ion etching), and then the photoresist 1001 is removed.

Figure 14:
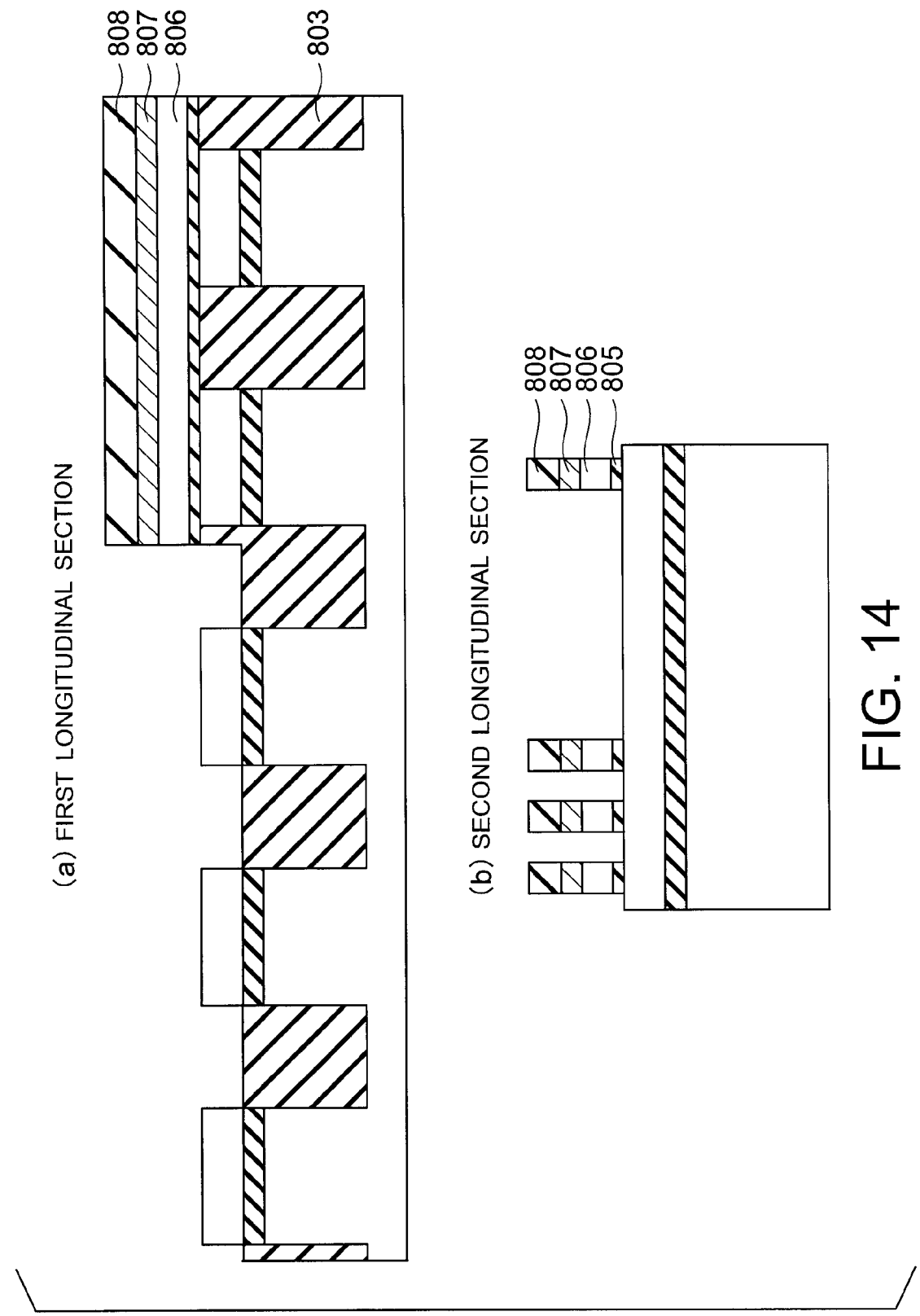
FIG. 14 is a sectional view subsequent to FIG. 12.
Figure 15:
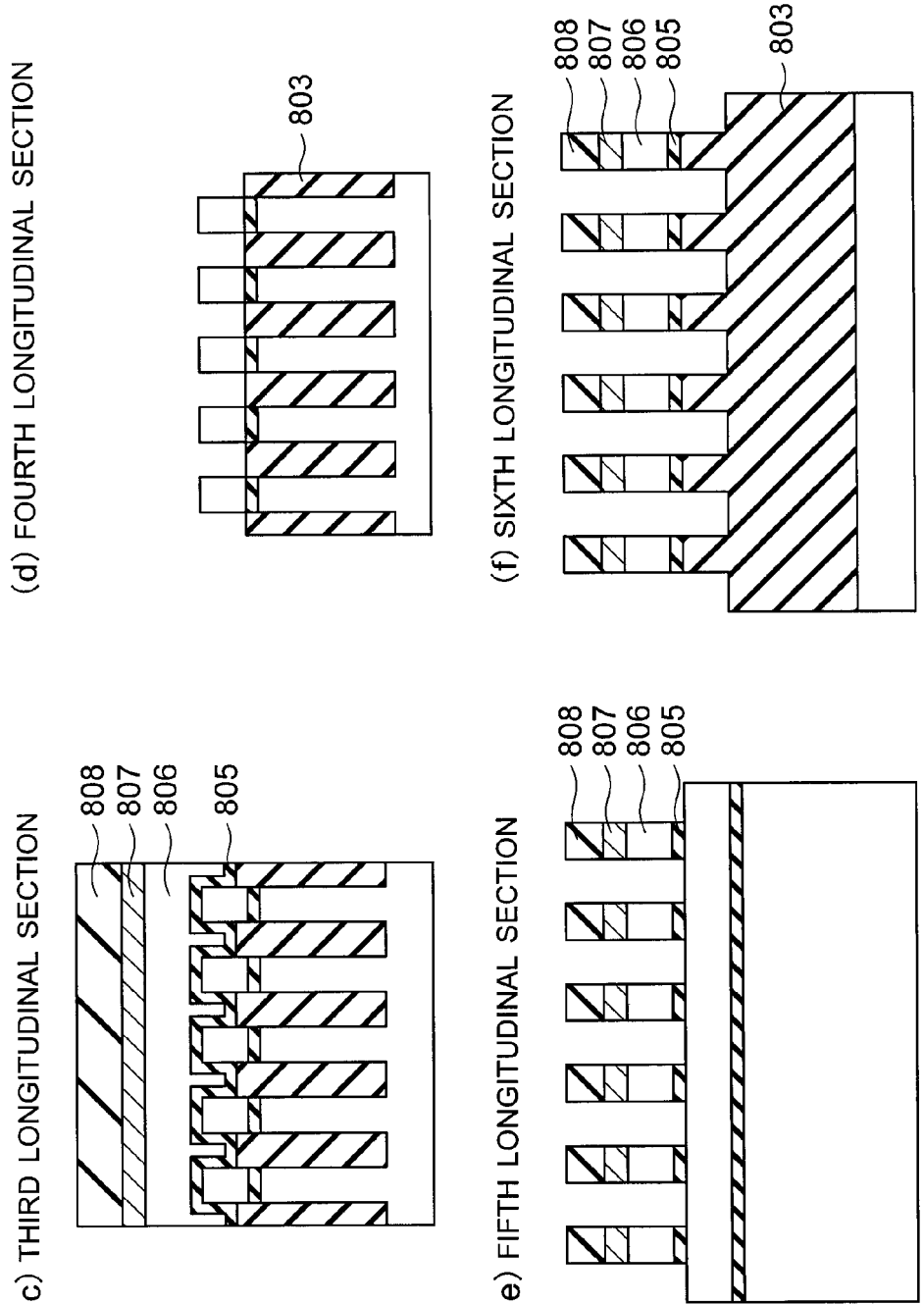
FIG. 15 is a sectional view subsequent to FIG. 13.

As shown in FIG. 14, FIG. 15, the silicon nitride film 808 is used as a mask to remove the tungsten silicide film 807, the polysilicon film 806, and the interpoly insulating film 805 by RIE. In this way, a word line with an end which is in a straight line shape is formed. Therefore, the second direction corresponds to the word line direction. In the formation of the word line, the element isolation insulating film 803 is also partly removed.

Figure 16:
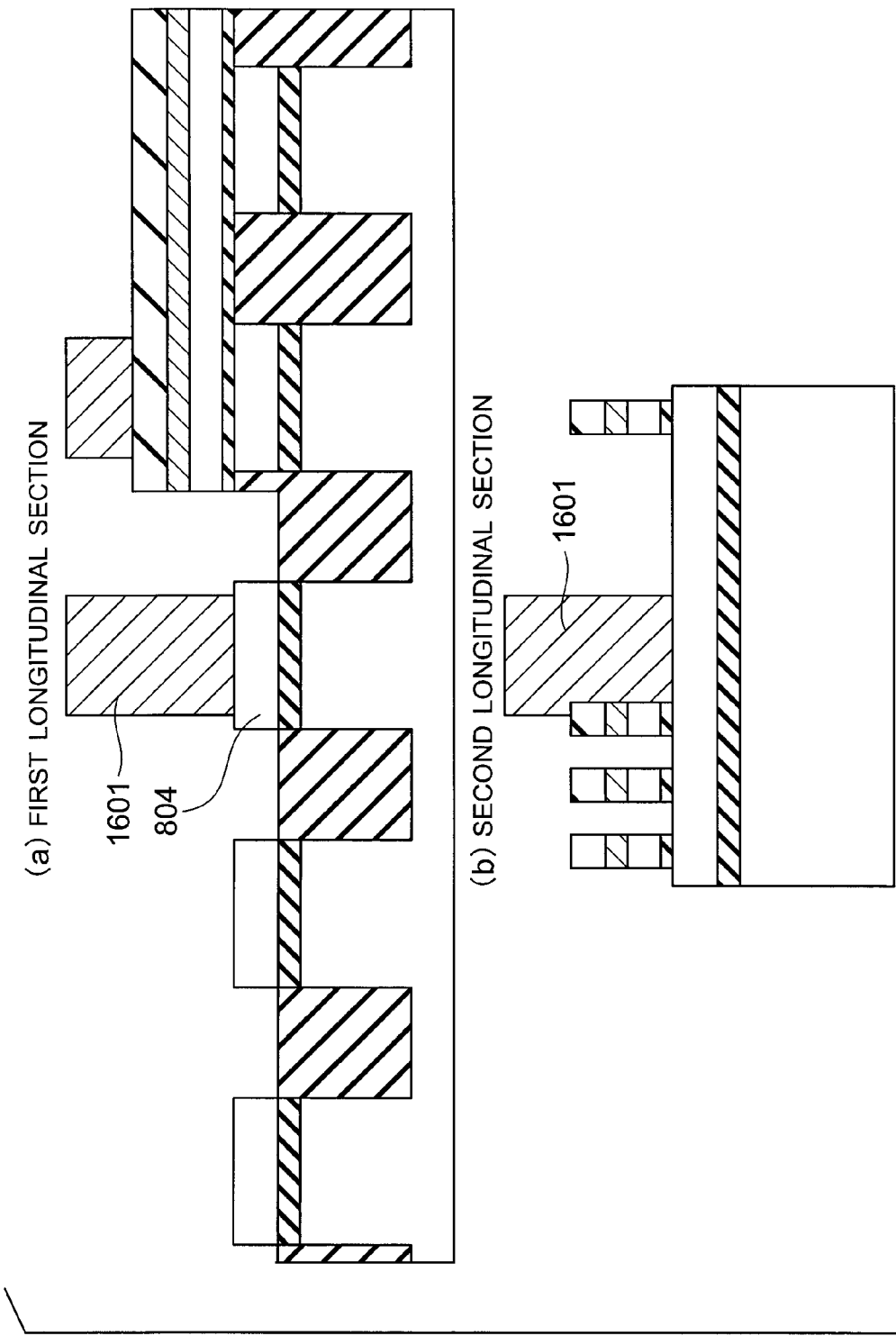
FIG. 16 is a sectional view subsequent to FIG. 14.

As shown in FIG. 16 and FIG. 17, a photoresist 1601 is applied and is patterned by lithography technology so as to leave the photoresist 1601 at the regions where contact plugs are formed in a later step.

Figure 18:
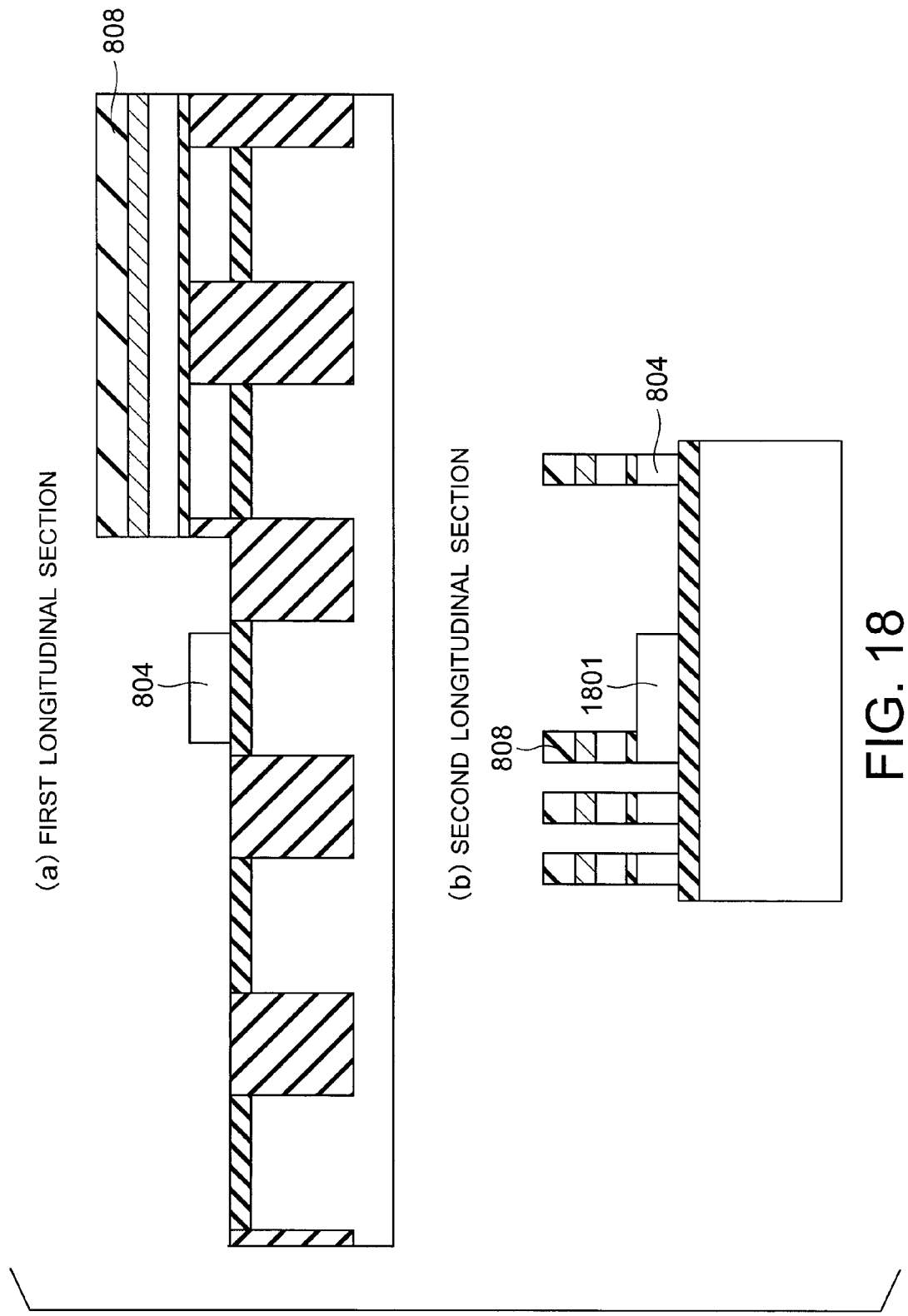
FIG. 18 is a sectional view subsequent to FIG. 16.

As shown in FIG. 18 and FIG. 19, the silicon nitride film 808 and the patterned photoresist 1601 are used as a mask to remove the polysilicon film 804 by RIE, and then the patterned photoresist 1601 is removed. In this way, a polysilicon film 1801 is left to function as stoppers (receiver) when a contact hole is made in a later step.

Figure 20:
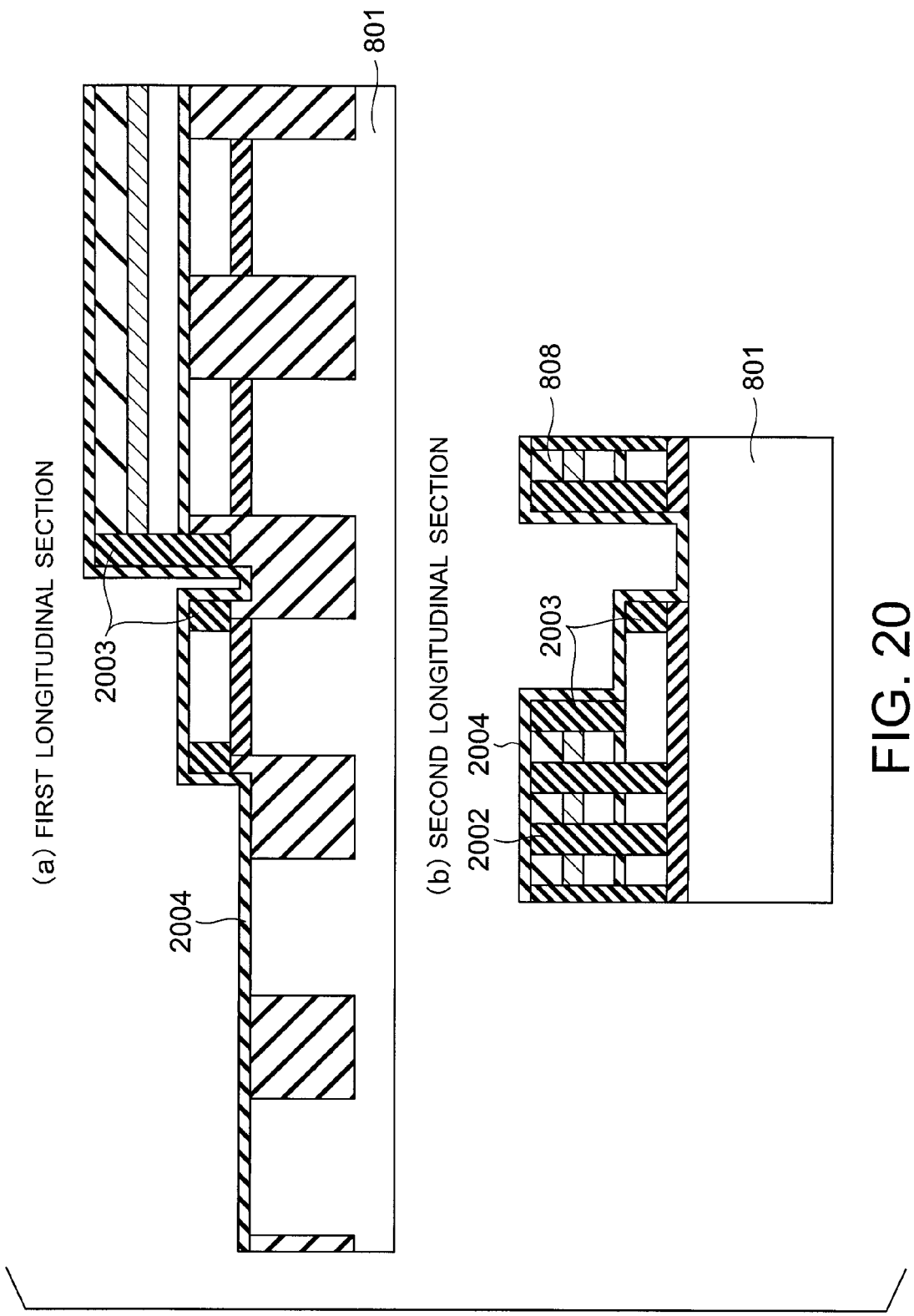
FIG. 20 is a sectional view subsequent to FIG. 18.
Figure 21:
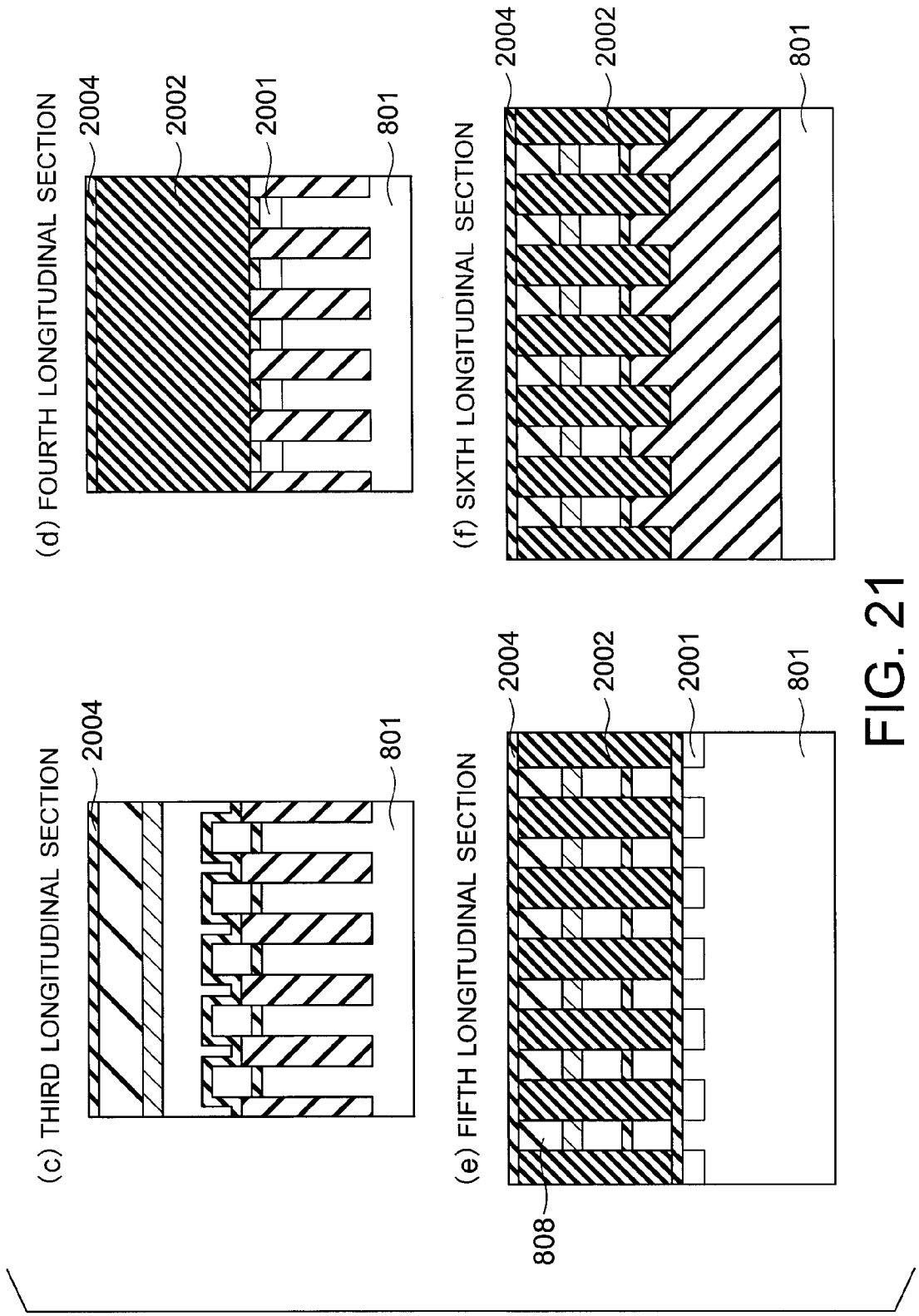
FIG. 21 is a sectional view subsequent to FIG. 19.

As shown in FIG. 20 and FIG. 21, the silicon nitride film 808 is used as a mask to introduce phosphorus ion by ion implantation to the silicon substrate 801 at the central region of the cell array, and the ion is activated by thermal annealing to form a dispersing layer 2001.

Furthermore, on a side of the gate of the peripheral circuit, a side wall spacer of a silicon dioxide film for example is formed to introduce impurities before and after the spacer is formed, so that an LDD (Lightly Doped Drain) structure is formed. At this step, an interlayer insulating films 2002 and a spacer 2003 are formed at the cell array portion. A silicon nitride film 2004 is also to be formed to cover the silicon nitride film 808, the interlayer insulating film 2002, and the spacer 2003.

Figure 22:
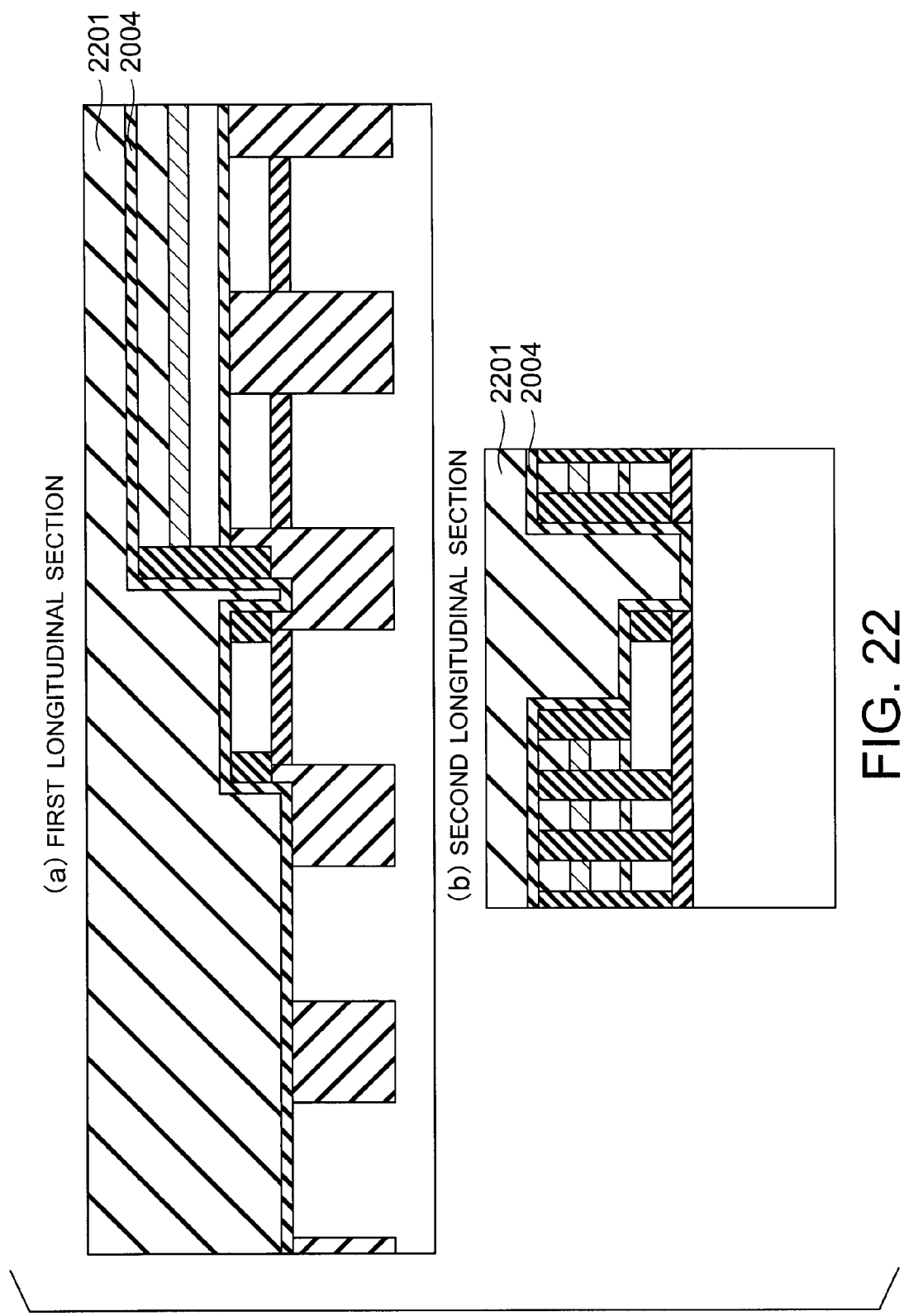
FIG. 22 is a sectional view subsequent to FIG. 20.
Figure 23:
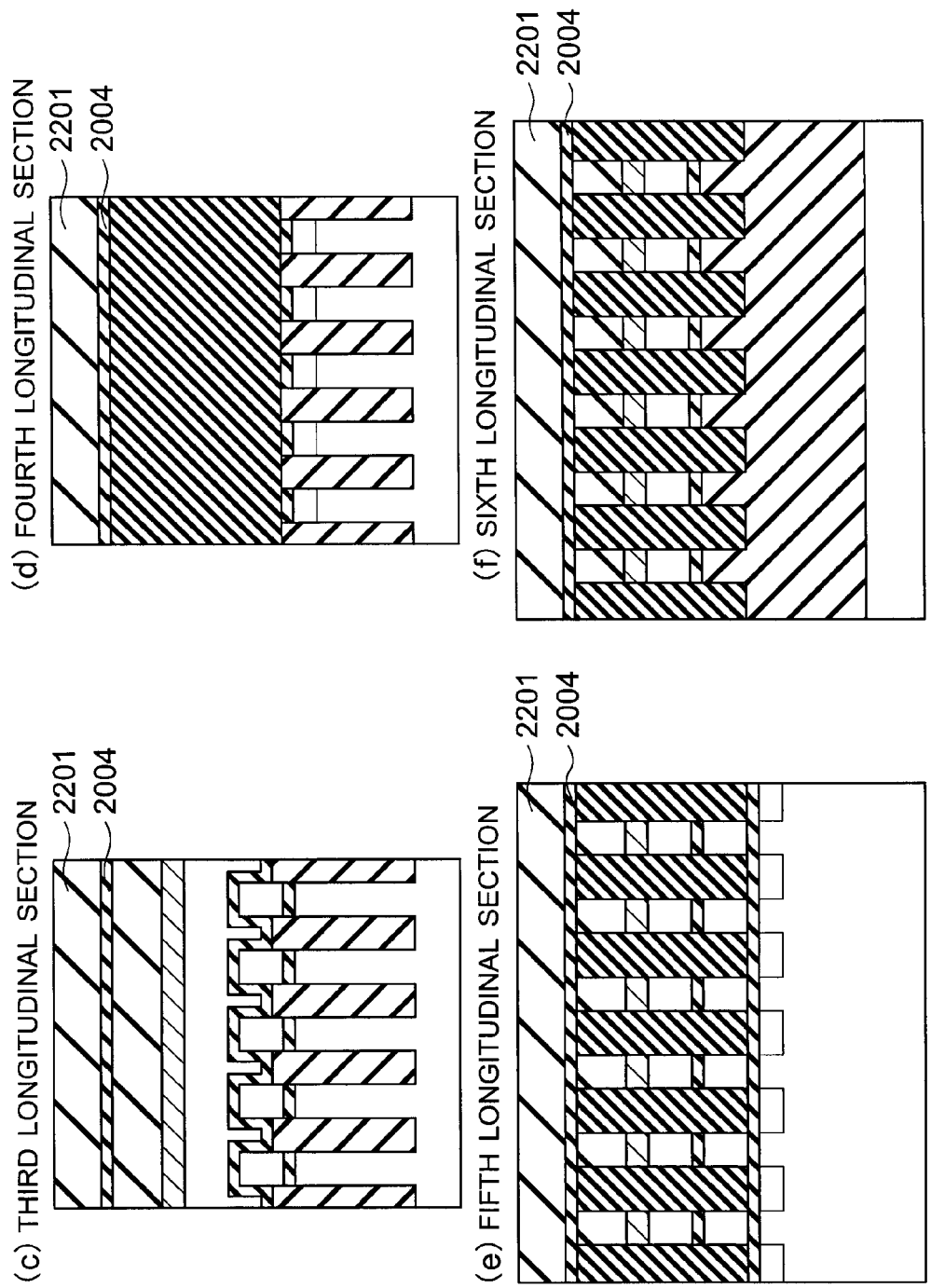
FIG. 23 is a sectional view subsequent to FIG. 21.

As shown in FIG. 22 and FIG. 23, a BPSG (Boron Phosphorus Silicon Glass) film (interlayer insulating film) 2201 is formed on the silicon nitride film 2004, which is subjected to a heat treatment for reflowing, and is flattened by CMP (chemical mechanical polishing) technique.

Figure 24:
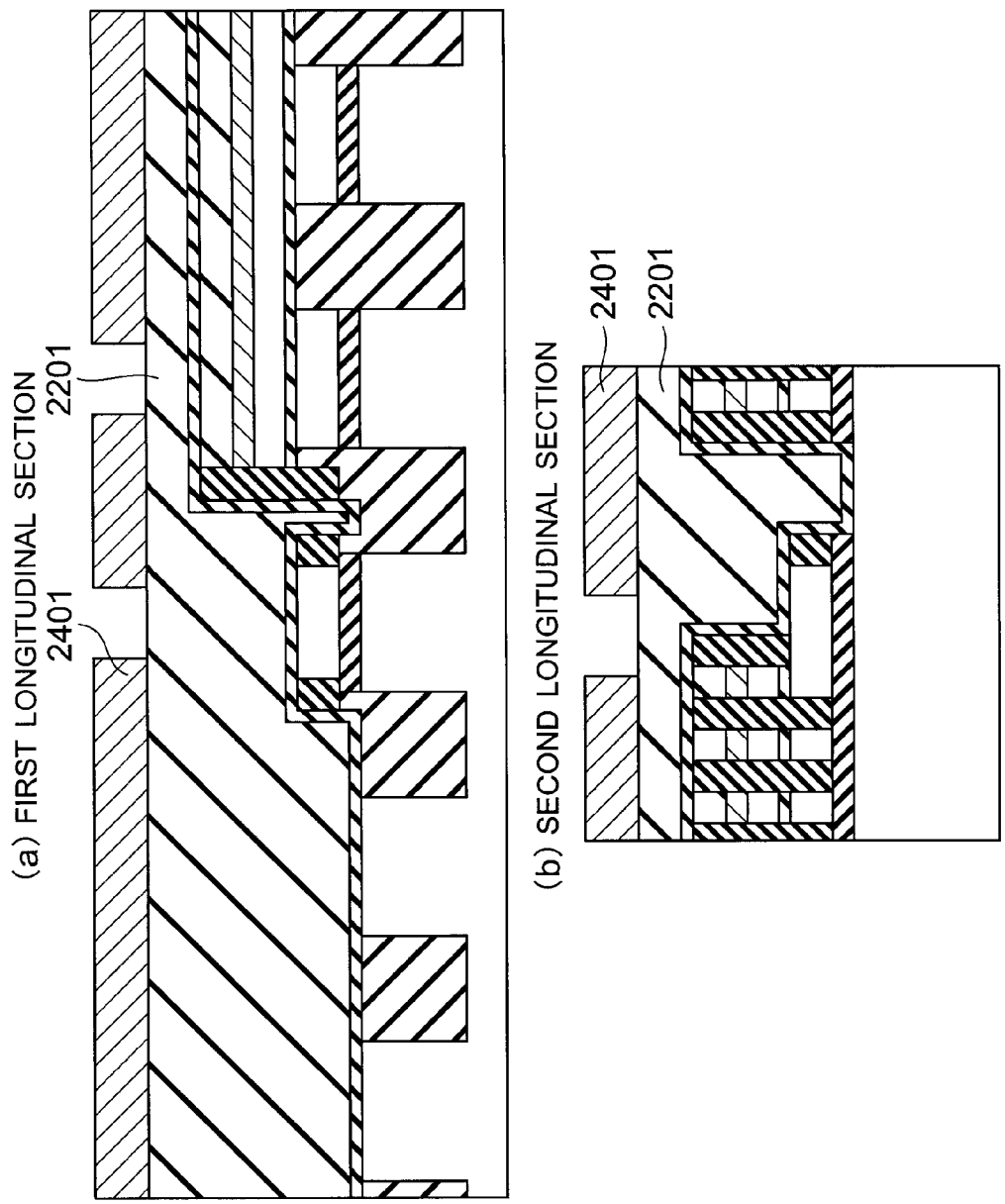
FIG. 24 is a sectional view subsequent to FIG. 22.
Figure 25:
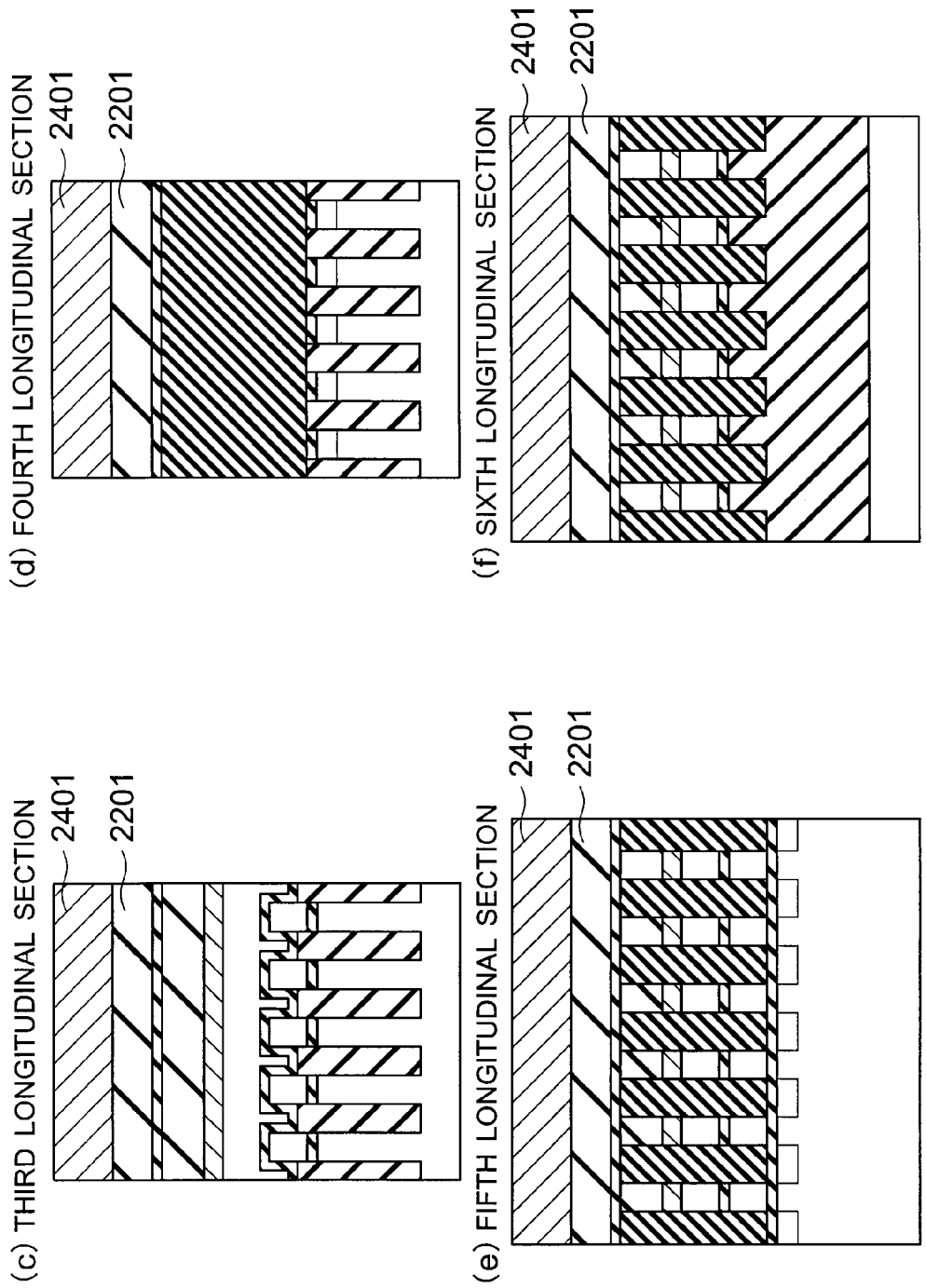
FIG. 25 is a sectional view subsequent to FIG. 23.

As shown in FIG. 24 and FIG. 25, the BPSG film 2201 is coated with a photoresist 2401 which is patterned by lithography technology to form a contact hole.

Figure 26:
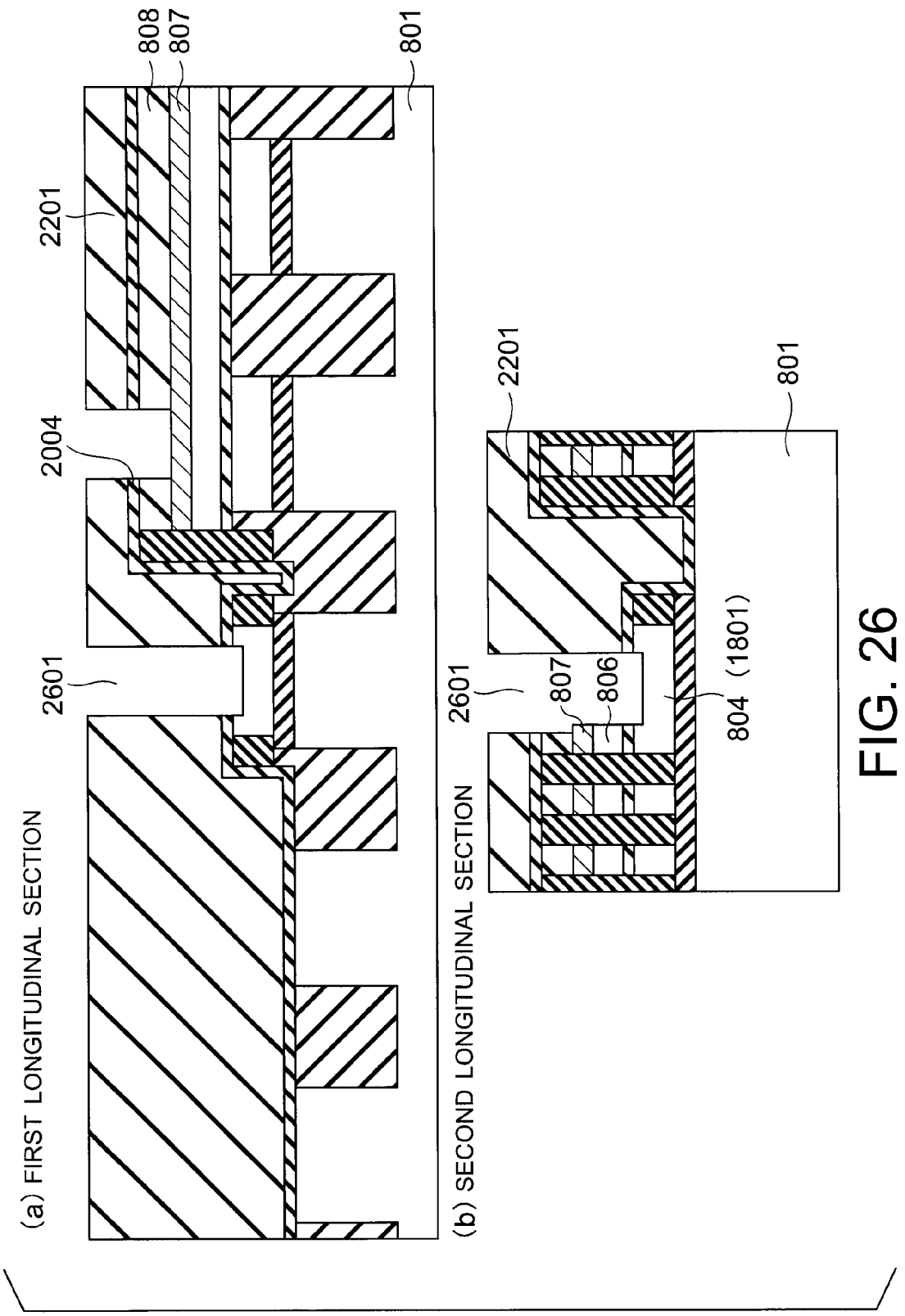
FIG. 26 is a sectional view subsequent to FIG. 24.
Figure 27:
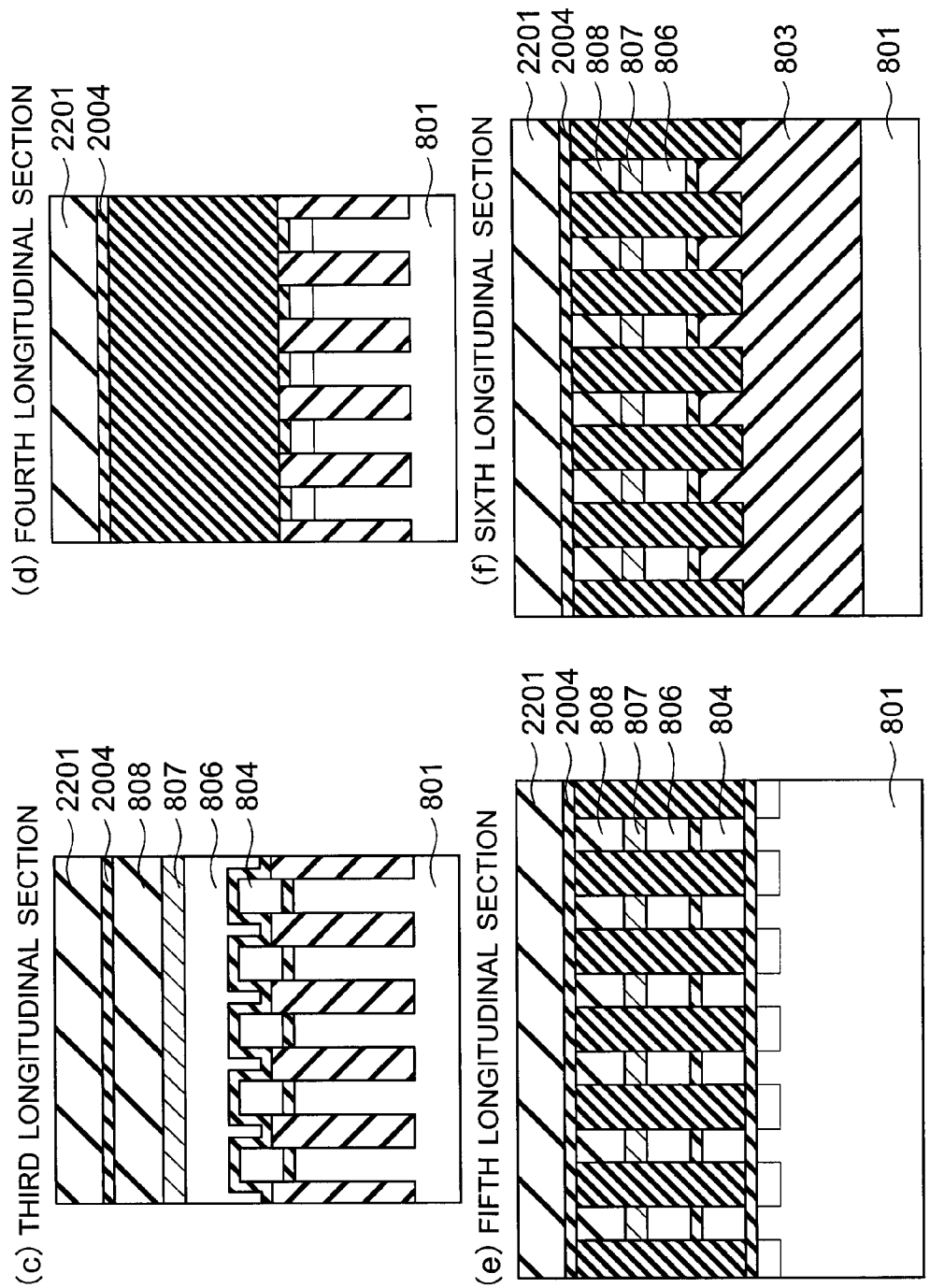
FIG. 27 is a sectional view subsequent to FIG. 25.

As shown in FIG. 26 and FIG. 27, the patterned photoresist 2401 is used as a mask to remove the BPSG film 2201 and the silicon nitride films 2004 and 808 by RIE, and to make a contact hole 2601 so that the tungsten silicide film 807 and the polysilicon films 806, 804 (1801) are exposed. Then, the patterned photoresist 2401 is removed.

When the contact hole 2601 is made simultaneously with a contact hole on the substrate in a peripheral circuit (not shown) which should be deeper than the contact hole 2601 under the same etching condition, the polysilicon film 804 (1801) functions as a stopper for preventing the contact hole 2601 from reaching the silicon substrate 801. This is because the polysilicon film is formed of a different material from that of the interlayer insulating film and has a different etching selection ratio.

As shown in FIG. 28 and FIG. 29, a titanium/titanium nitride film as a barrier metal layer and a tungsten film 2801 as a contact plug are formed and flattened by CMR Since the contact hole 2601 is prevented from reaching the silicon substrate 801 in the step shown in FIG. 26, the conduction of electricity between the contact plug and the silicon substrate 801 is prevented.

As described above, the conduction of electricity between the substrate and the contact plug formed at an end of the word line of a straight line shape is prevented, which provides a NAND-type non-volatile semiconductor memory device at high degree of integration and high process yield.

Comparative Embodiment

Figure 30:
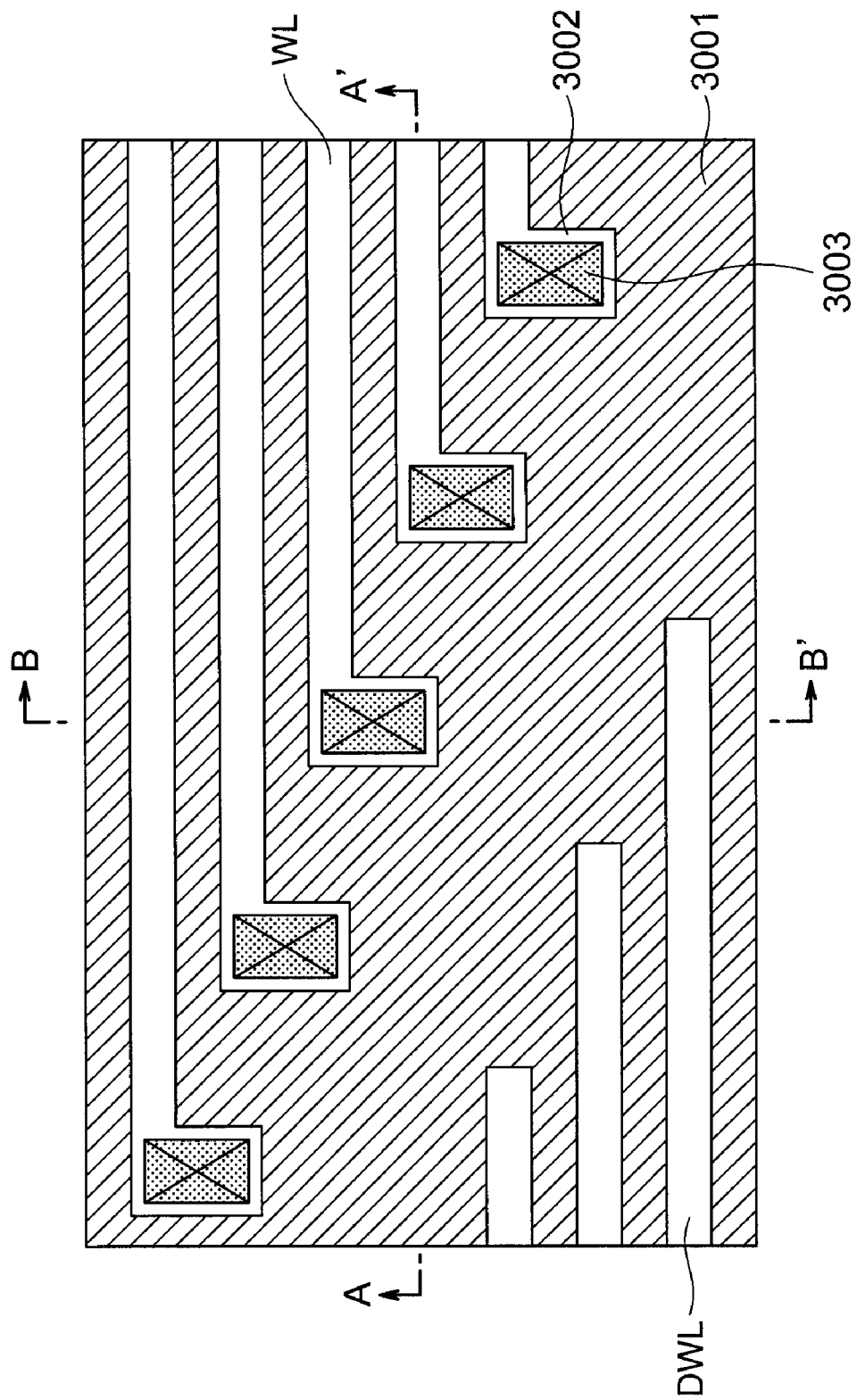
FIG. 30 is a view showing an upper surface of a NAND-type non-volatile semiconductor memory device according to a comparative embodiment.

FIG. 30 is a view showing an upper surface of an end portion of a memory cell array included in a NAND-type non-volatile semiconductor memory device according to a comparative embodiment. The NAND-type non-volatile semiconductor memory device includes word lines WL and dummy word lines DWL which are formed on the element isolation insulating film 3001 spaced apart at a predetermined distance from each other along a second direction (the lateral direction in FIG. 30), fringes 3002 formed at the end portions of the word lines WL, and contact plugs 3003 which are mounted so as to be received in the fringes 3002. The adjacent word lines WL have different lengths from each other. The central region of the memory cell array has a configuration similar to that of a general NAND-type non-volatile semiconductor memory device.

Figure 31:
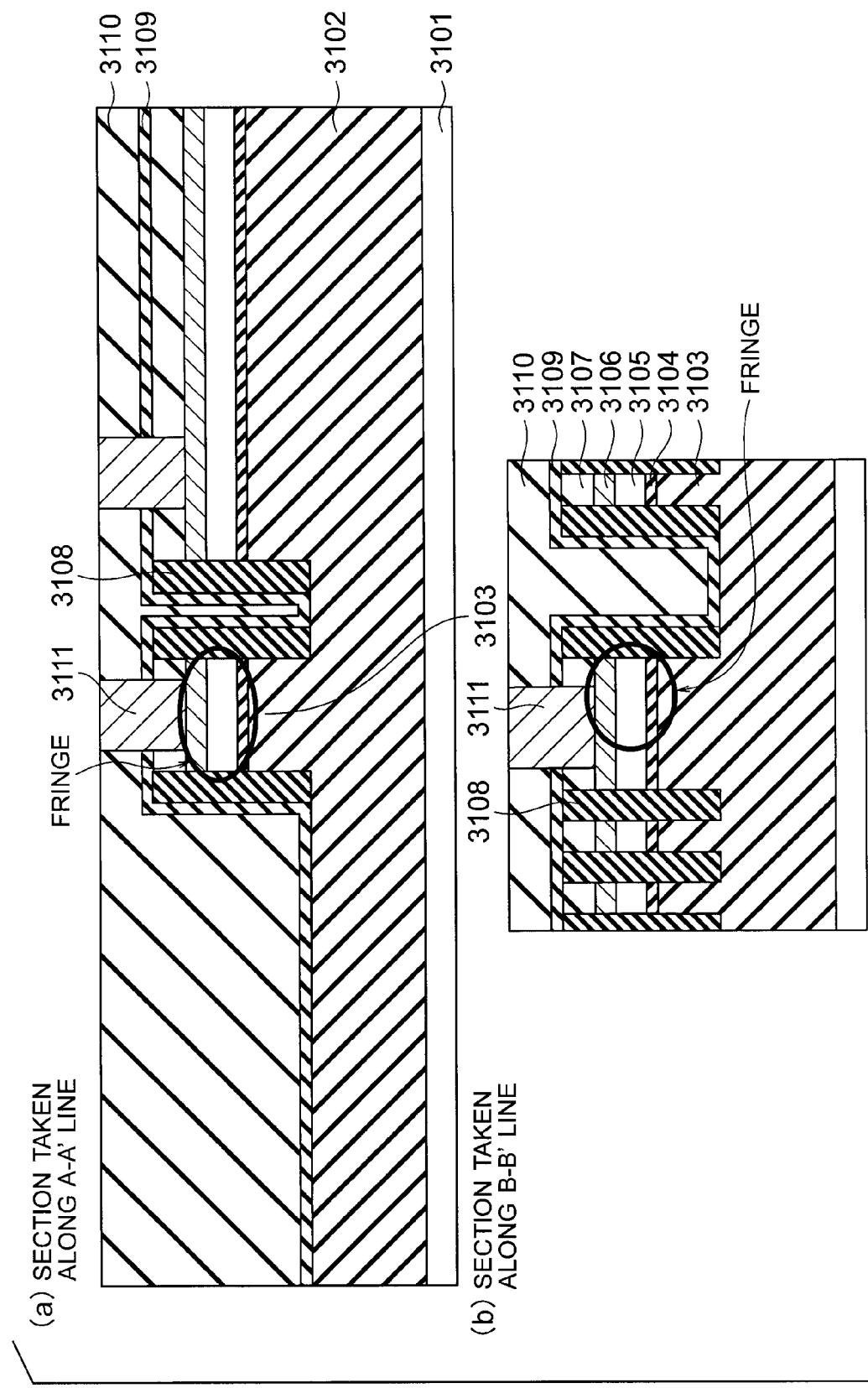
FIG. 31 is a longitudinal sectional view of a NAND-type non-volatile semiconductor memory device according to the comparative embodiment.

FIGS. 31 shows the longitudinal sections taken along the line A-A' and the line B-B' respectively shown in FIG. 30. The silicon substrate 3101 has an element isolation insulating film 3102 formed thereon. The element isolation insulating film 3102 has an upper portion having a convex-concave shape on which an interpoly insulating film 3104, a polysilicon film 3105, a tungsten silicide film 3106, and a silicon nitride film 3107 are laminated in order, and on the side of the laminated structure insulating films 3108 are formed.

A silicon nitride film 3109 is formed to cover the element isolation insulating film 3102, the insulating film 3108 and the silicon nitride film 3107, and an interlayer insulating film 3110 is formed on the silicon nitride film 3109.

Furthermore, a contact plug 3111 is formed through the interlayer insulating film 3110 and the silicon nitride films 3109 and 3107 so as to conduct electricity to the tungsten silicide film 3106.

The fringes 3002 are formed as shown in FIG. 30 in consideration of the misalignment during the formation of the contact plug 3111. However, due to the microfabrication for a high degree of integration of elements, a formation of the word line and the fringes in the same step using lithography technology having high resolution in one direction (in the word line WL direction) causes the loss of the regular pattern of the structure at the positions where the fringes are formed, resulting in that diffracted light is hard to enter and the resolution is degraded.

Figure 32:
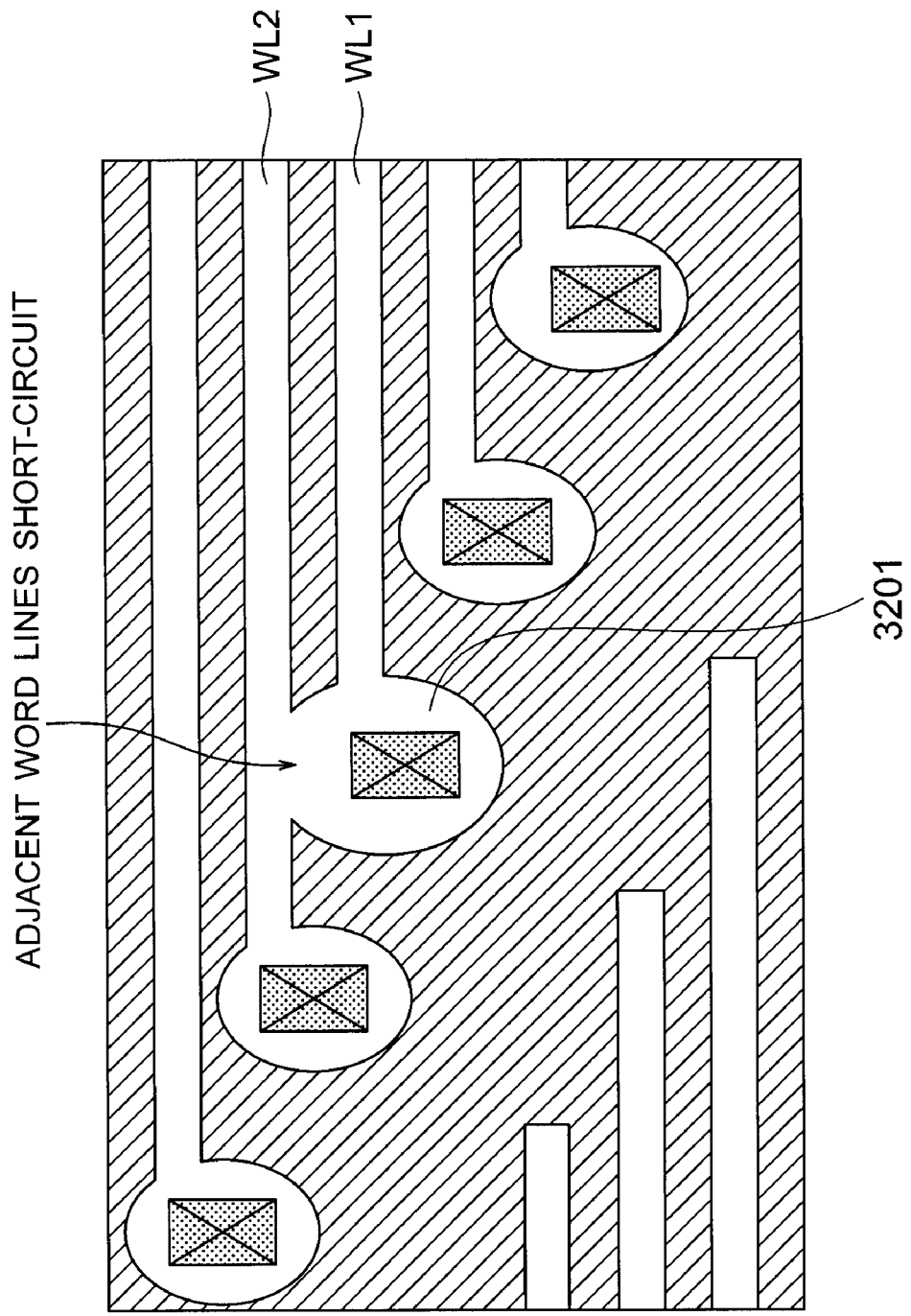
FIG. 32 is a view showing an upper surface of a NAND-type non-volatile semiconductor memory device according to a comparative embodiment.

As a result, as shown in FIG. 32, the fringe 3201 which is formed at the end portion of a word line WL1 may contact a word line WL2 and short-circuit.

Figure 33:
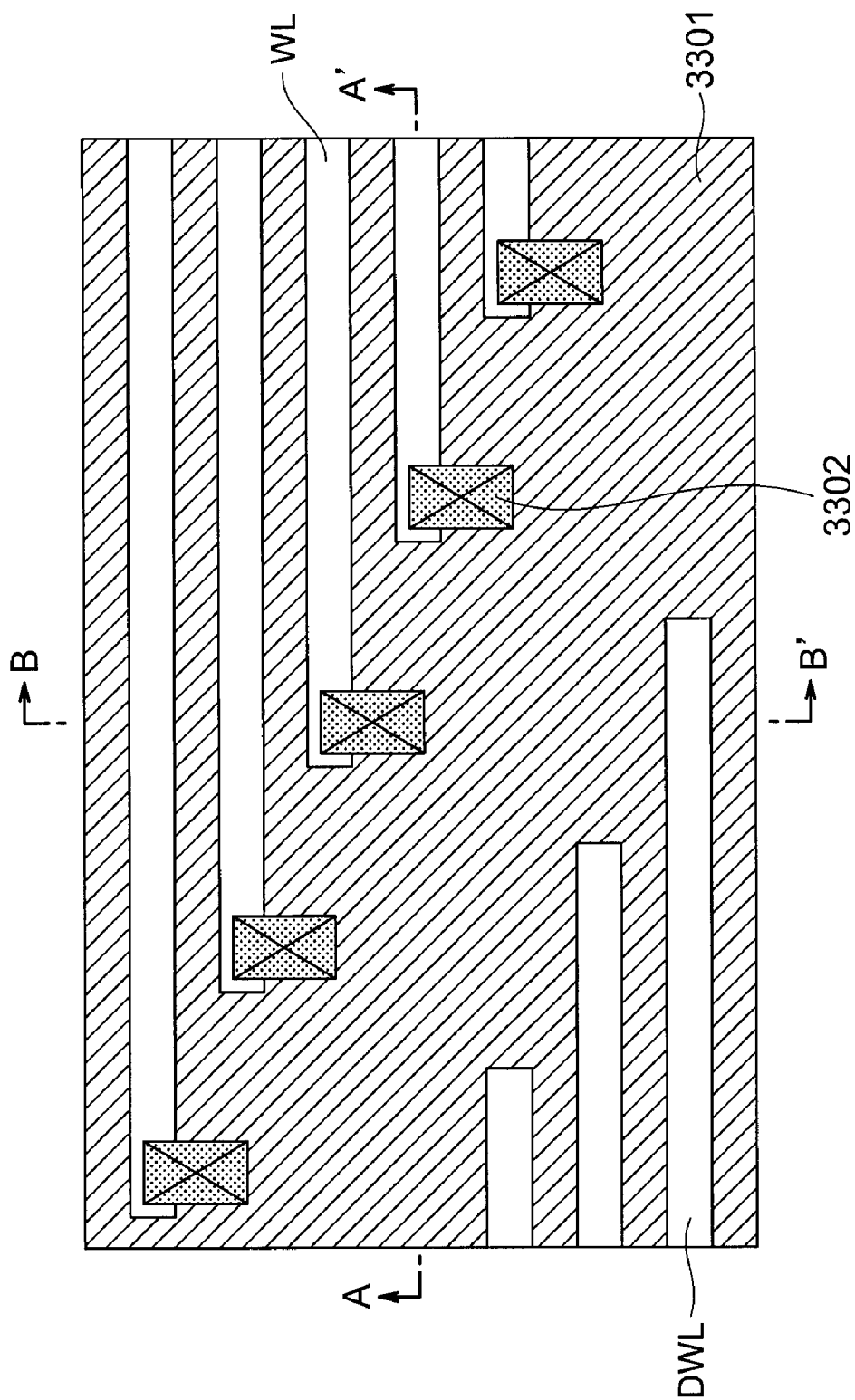
FIG. 33 is a view showing an upper surface of a NAND-type non-volatile semiconductor memory device according to a comparative embodiment.

FIG. 33 shows an upper surface of an end of a memory cell array included in a NAND-type non-volatile semiconductor memory device, in a case where the end portion of the word line is formed in a straight line shape instead of providing a fringe. An element isolation insulating film 3301 is provided with word lines WL and dummy word lines DWL formed thereon spaced apart at a predetermined distance from each other along a second direction (the lateral direction in FIG. 33), and contact plugs 3302 which are formed to be partly engaged in word lines WL individually.

The adjacent word lines WL have different lengths from each other so that the contact plugs 3302 are formed not to contact with the adjacent word lines WL individually.

In this case, the processing of the contact plugs 3302 together with the contact holes on the substrate of a peripheral circuit decreases the manufacturing cost.

Figure 34:
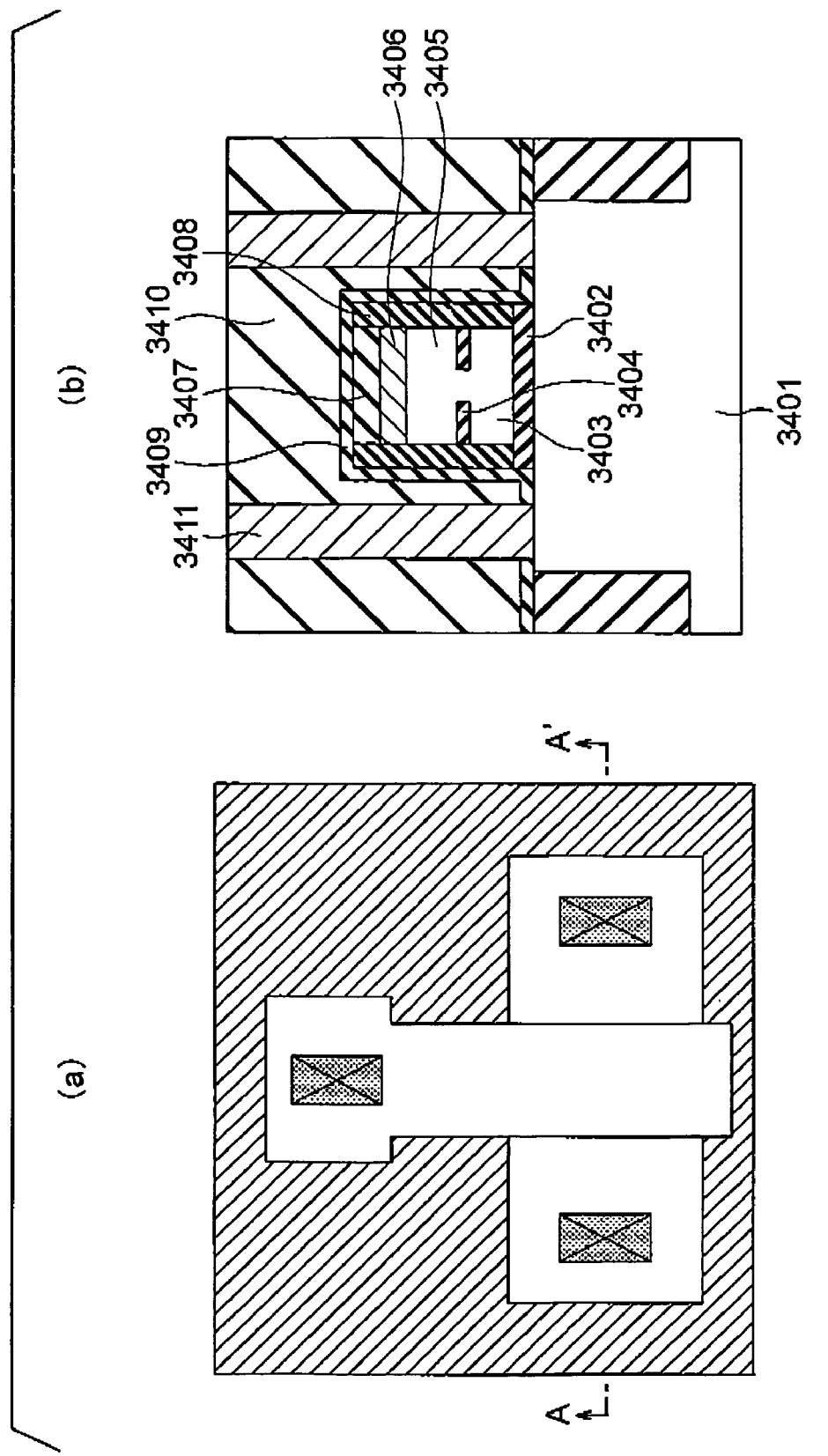
FIG. 34 is a view showing a schematic structure of a peripheral transistor.

FIG. 34(a) shows an upper surface of a peripheral transistor, and FIG. 34(b) shows a longitudinal section taken along the line A-A' in FIG. 34(a). A gate is formed on a silicon substrate 3401 by laminating a silicon dioxide film 3402, a polysilicon film 3403, an insulating film 3404, a polysilicon film 3405, a tungsten silicide film 3406, and a silicon nitride film 3407 is order.

The gate is provided with side wall spacers 3408 on the sides thereof so that an LDD structure is formed. A silicon nitride film 3409 is formed to cover the silicon substrate 3401, the side wall spacers 3408, and the silicon nitride film 3407, and on the silicon nitride film 3409 an interlayer insulating film 3410 is formed.

Contact plugs 3411 are formed through the interlayer insulating film 3410 and the silicon nitride film 3409 to conduct electricity to an impurity dispersing layer (not shown) which is formed on the surface portion of the silicon substrate 3401.

A contact hole for forming the contact plug 3411 in the peripheral circuit has a depth greater than that of a contact hole in a memory region. So, when the contact hole in a memory region is made under the etching condition for making a contact hole in the peripheral circuit, the contact hole is excessively etched, and reaches the substrate.

Figure 35:
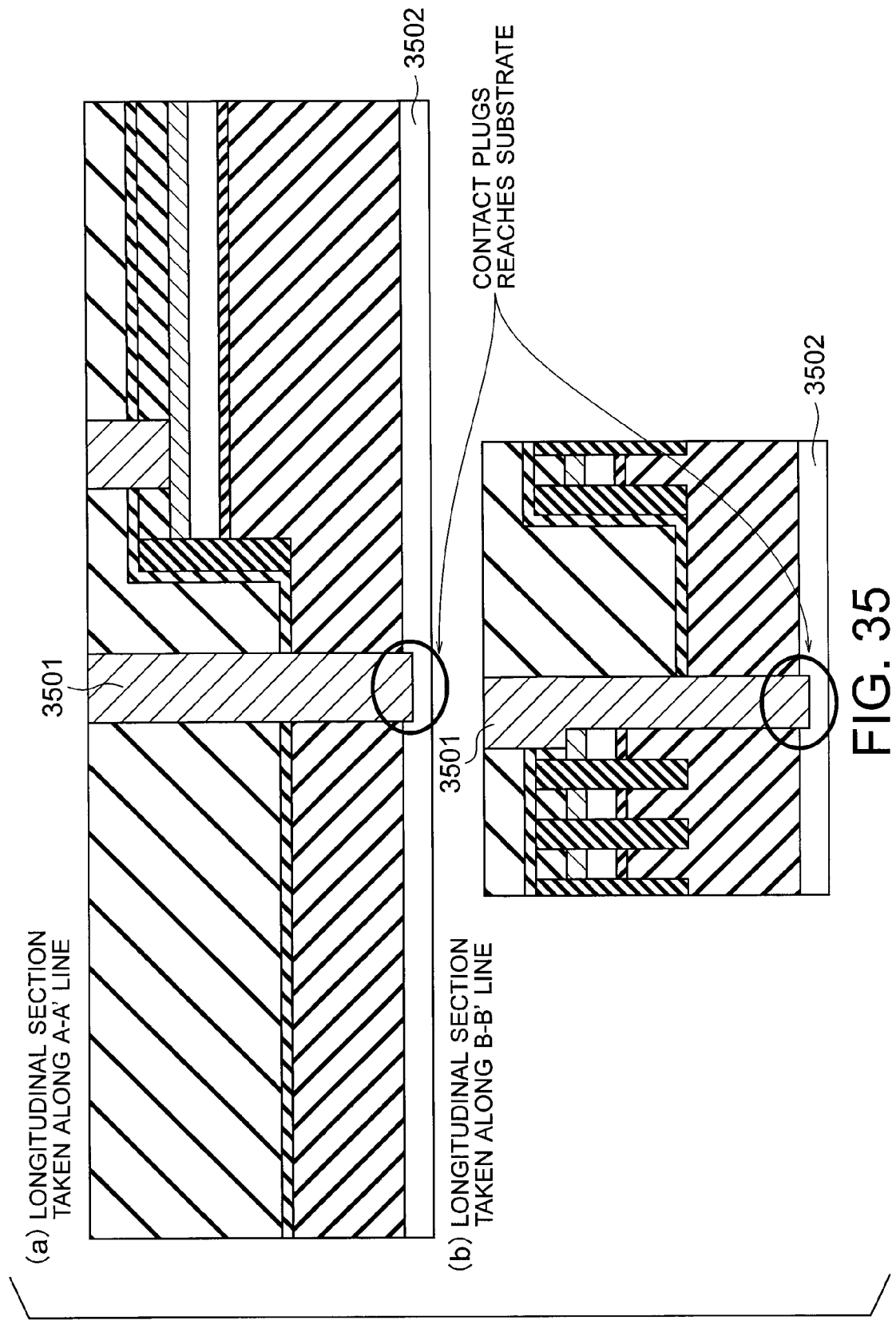
FIG. 35 is a longitudinal sectional view of a NAND-type non-volatile semiconductor memory device according to the comparative embodiment.

If a plug is formed in such a contact hole, as seen from FIG. 35 showing longitudinal sections taken along the line A-A' and the line B-B' in FIG. 33, the plug 3501 conducts electricity to the substrate 3502, which results in a short-circuit fault.

To the contrary, in the NAND-type non-volatile semiconductor memory device according to the present embodiment, as shown in FIG. 26, the silicon nitride film 2004 and the polysilicon film 804 (1801) function as stoppers to be able to prevent the contact hole 2601 from reaching the silicon substrate 801.

The above configuration prevents a contact plug from conducting electricity to a substrate when the contact plug is formed in a word line whose end is formed in a straight line shape and is suitable for lithography technology that is excellent in forming a pattern having a high resolution in one direction. As a result, a margin for exposure at the end of the word line can be secured, which provides a down-sized NAND-type non-volatile semiconductor memory device with high degree of integration and high process yield.

Figure 36:
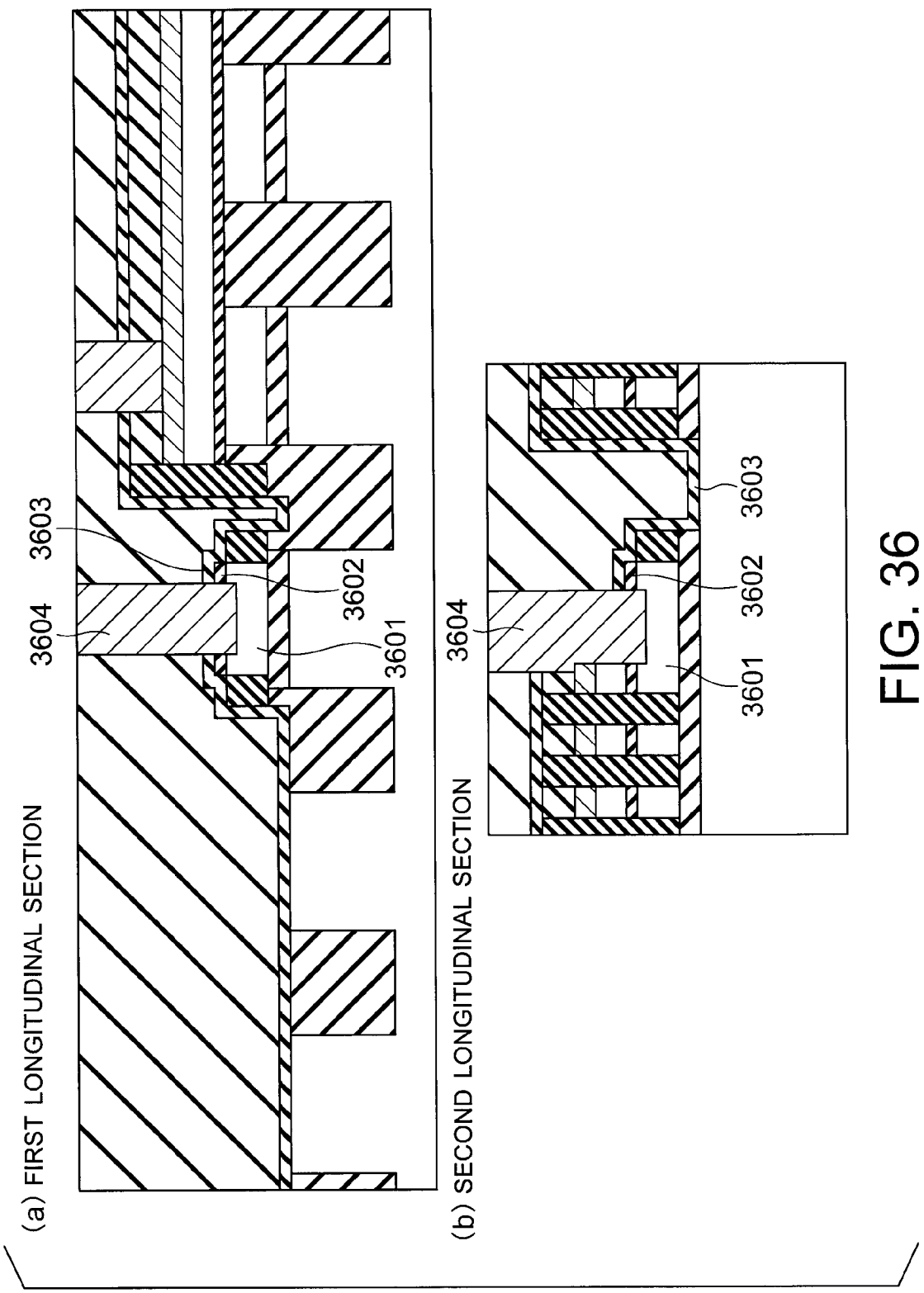
FIG. 36 is a longitudinal sectional view of the NAND-type non-volatile semiconductor memory device according to a modified embodiment.

In the above embodiment, up to the interpoly insulating the films 805 are removed by RIE in the step shown in FIG. 14 and FIG. 15, but the films may be left in the steps. In this case, the interpoly insulating film 805 is etched together with the silicon nitride film 2002 and the like in the step for making the contact hole 2601 shown in FIG. 26 and FIG. 27. As a result, as shown in FIG. 36, an interpoly insulating film 3602 and a silicon nitride film 3603 are formed on a polysilicon film 3601, and a contact plug 3604 is formed through the interpoly insulating film 3602 and the silicon nitride film 3603.

Also, in the above embodiment, a control gate is configured with a tungsten polycide (a laminated structure of tungsten silicide and polysilicon), but other silicide materials such as cobalt silicide may be used instead of tungsten silicide to obtain a polymetal gate structure.

What is claimed is:
1. A NAND-type non-volatile semiconductor memory device, comprising:
 a semiconductor substrate;
 a plurality of element isolation insulating films which are formed in the shape of strips spaced apart at a predeter- mined distance from each other on the semiconductor substrate along a column direction;

a first insulating film which is formed along the column direction in the shape of strips between the element isolation insulating films on the semiconductor substrate;

a plurality of floating gates which are formed on the first insulating film spaced apart at a predetermined distance from each other;

a plurality of second insulating films which are formed spaced apart at a predetermined distance from each other to span the element isolation insulating films on the floating gate along a row direction that is orthogonal to the column direction;

a plurality of control gates which are formed on the second insulating films along the row direction in the shape of strips; and a contact plug which directly contacts the upper and side surfaces of the control gate, wherein the floating gate below the contact plug has a length in the column direction which is greater than that of the control gate in the column direction, and a lower surface of the contact plug directly contacts an upper surface of the floating gate.

2. The NAND-type non-volatile semiconductor memory device according to claim 1, wherein
the contact plug has a length in the row direction which is less than that of the floating gate in the row direction.

3. The NAND-type non-volatile semiconductor memory device according to claim 2, wherein
the first insulating film below the contact plug has a film thickness which is equal to that of a gate insulating film of a high voltage resistant transistor in a peripheral circuit.

4. The NAND-type non-volatile semiconductor memory device according to claim 1, wherein
the first insulating film below the contact plug has a film thickness which is equal to that of a gate insulating film of a high voltage resistant transistor in a peripheral circuit.

5. The NAND-type non-volatile semiconductor memory device according to claim 1, wherein
two adjacent control gates have different lengths in the row direction.

6. The NAND-type non-volatile semiconductor memory device according to claim 1, further comprising:
a dummy word line which is formed in the shape of strip along the row direction on an extended line from the control gate.

7. The NAND-type non-volatile semiconductor memory device according to claim 1, further comprising:
an interlayer insulating film which is formed to cover the side surfaces of the contact plug.

8. The NAND-type non-volatile semiconductor memory device according to claim 7, wherein
the floating gate is a polysilicon film.

9. A NAND-type non-volatile semiconductor memory device, comprising:
a semiconductor substrate;
a plurality of first element isolation insulating films which are formed in the shape of strips spaced apart at a predetermined first distance from each other on the semiconductor substrate along a column direction;
a plurality of second element isolation insulating films which are formed in the shape of strips spaced apart at a predetermined second distance from each other, the plurality of second element isolation insulating films being located next to the plurality of first element isolation insulating films on the semiconductor substrate along the column direction;

a first insulating film which is formed along the column direction in the shape of strips between the first element isolation insulating films on the semiconductor substrate;

a second insulating film which is formed along the column direction in the shape of strips between the second element isolation insulating films on the semiconductor substrate;

a plurality of floating gates which are formed on the first and second insulating films spaced apart at a predetermined third distance from each other;

a plurality of third insulating films which are formed spaced apart at a predetermined fourth distance from each other to span the first and second element isolation insulating films on the floating gates along a row direction that is orthogonal to the column direction;

a plurality of control gates which are formed on the third insulating films along the row direction in the shape of strips; and a contact plug which directly contacts the upper and side surfaces of the control gate above the second insulating film, wherein the floating gate below the contact plug has a length in the column direction which is greater than that of the control gate in the column direction, and a lower surface of the contact plug directly contacts an upper surface of the floating gate.

10. The NAND-type non-volatile semiconductor memory device according to claim 9, wherein
the contact plug has a length in the row direction which is less than that of the floating gate in the row direction.

11. The NAND-type non-volatile semiconductor memory device according to claim 10, wherein
the second insulating film below the contact plug has a film thickness which is equal to that of a gate insulating film of a high voltage resistant transistor in a peripheral circuit.

12. The NAND-type non-volatile semiconductor memory device according to claim 9, wherein
the second insulating film below the contact plug has a film thickness which is equal to that of a gate insulating film of a high voltage resistant transistor in a peripheral circuit.

13. The NAND-type non-volatile semiconductor memory device according to claim 9, wherein
two adjacent control gates have different lengths in the row direction.

14. The NAND-type non-volatile semiconductor memory device according to claim 9, further comprising:
a dummy word line which is formed in the shape of strip along the row direction on an extended line from the control gate.

15. The NAND-type non-volatile semiconductor memory device according to claim 9, further comprising:
an interlayer insulating film which is formed to cover the side surfaces of the contact plug.

16. The NAND-type non-volatile semiconductor memory device according to claim 9, wherein
the second distance is greater than the first distance.

17. The NAND-type non-volatile semiconductor memory device according to claim 9, wherein
the space between the second element isolation insulating films is greater than the space between the first element isolation insulating films.

18. The NAND-type non-volatile semiconductor memory device according to claim 9, wherein
the contact plug is located in an end portion of the control gate.

19. The NAND-type non-volatile semiconductor memory device according to claim 9, wherein
the width of the floating gate below the contact plug in the column direction is greater than the width of the floating gate above the first insulating film in the column direction.

* * * * *